United States Patent [19]

Custode

[11] Patent Number: 5,051,805
[45] Date of Patent: * Sep. 24, 1991

[54] SUB-MICRON BIPOLAR DEVICES WITH SUB-MICRON CONTACTS

[75] Inventor: Frank Z. Custode, Norco, Calif.

[73] Assignee: Rockwell International Corporation, El Segundo, Calif.

[*] Notice: The portion of the term of this patent subsequent to Aug. 7, 2007 has been disclaimed.

[21] Appl. No.: 529,020

[22] Filed: May 25, 1990

Related U.S. Application Data

[62] Division of Ser. No. 73,591, Jul. 15, 1987.

[51] Int. Cl.⁵ .............................. H01L 29/72
[52] U.S. Cl. .................... 357/34; 357/23.1; 357/49; 357/59; 357/71
[58] Field of Search ............ 357/34, 35, 49, 59 H, 357/23.1, 71, 71 S

[56] References Cited

U.S. PATENT DOCUMENTS

| 4,407,060 | 10/1983 | Sakurai | 357/59 H |
|---|---|---|---|
| 4,415,371 | 11/1983 | Soclof | 357/34 |
| 4,495,512 | 1/1985 | Isaac et al. | 357/71 |
| 4,522,682 | 6/1985 | Soclof | 357/35 |
| 4,641,170 | 2/1987 | Ogura et al. | 357/35 |
| 4,719,185 | 1/1988 | Goth | 357/34 |
| 4,722,908 | 2/1988 | Burton | 357/34 |
| 4,752,817 | 6/1988 | Lechaton | 357/34 |
| 4,803,175 | 2/1989 | Alvarez et al. | 357/34 |
| 4,818,713 | 4/1989 | Feygenson | 357/34 |
| 4,883,772 | 11/1989 | Cleeves et al. | 357/34 |
| 4,920,401 | 4/1990 | Sakai et al. | 357/34 |
| 4,933,742 | 6/1990 | Brown et al. | 357/71 |
| 4,947,225 | 8/1990 | Custode | 357/49 |
| 4,980,738 | 12/1990 | Welch et al. | 357/34 |

FOREIGN PATENT DOCUMENTS

| 58-43573 | 3/1983 | Japan | 357/34 |
|---|---|---|---|
| 60-74682 | 4/1985 | Japan | 357/23.1 |

Primary Examiner—Rolf Hille
Assistant Examiner—Steven Loke
Attorney, Agent, or Firm—H. Fredrick Hamann; George A. Montanye; Wilfred G. Caldwell

[57] ABSTRACT

The sub-micron bipolar devices with method for forming sub-micron contacts provides a sub-micron bipolar device and process for manufacturing it with contacts down to 0.1 microns or less. All processes and devices utilize doped polysilicon as the electrodes for the device elements, and the preferred embodiment surrounds the polysilicon contacts with low temperature oxide covered by SOG to avoid all oxidation steps which otherwise might be detrimental to the extremely thin whisker contacts.

3 Claims, 20 Drawing Sheets

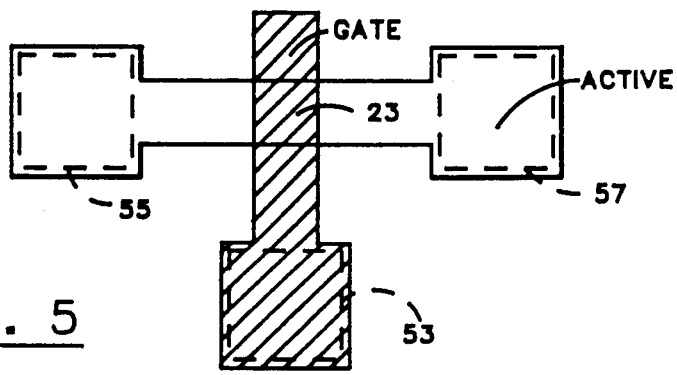
FIG. 5
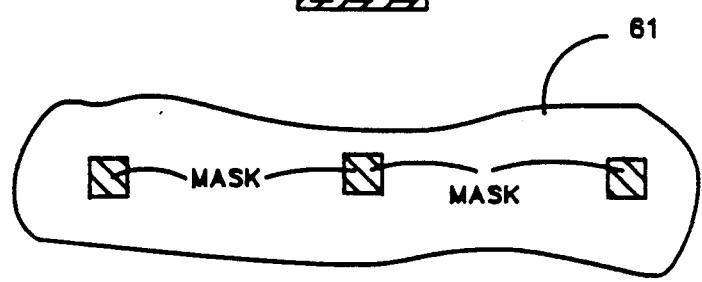
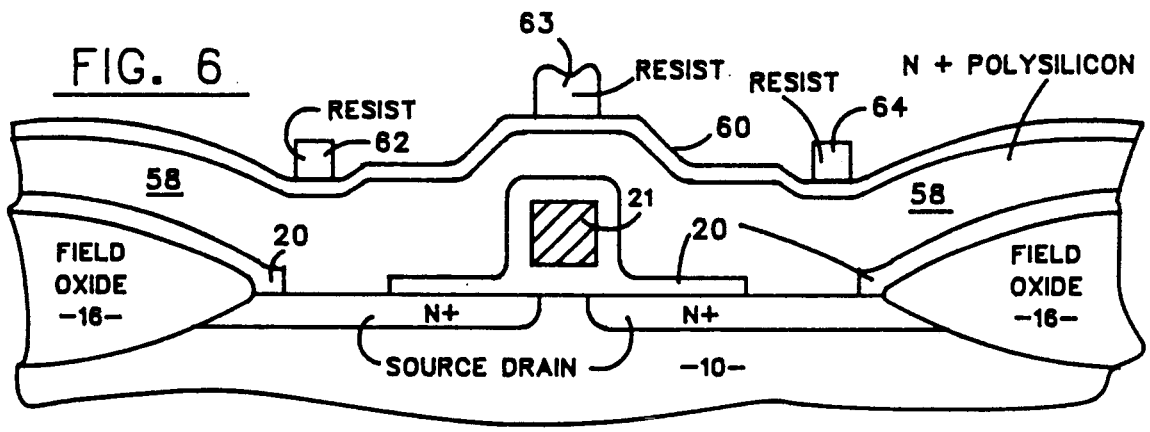
FIG. 6
FIG. 7
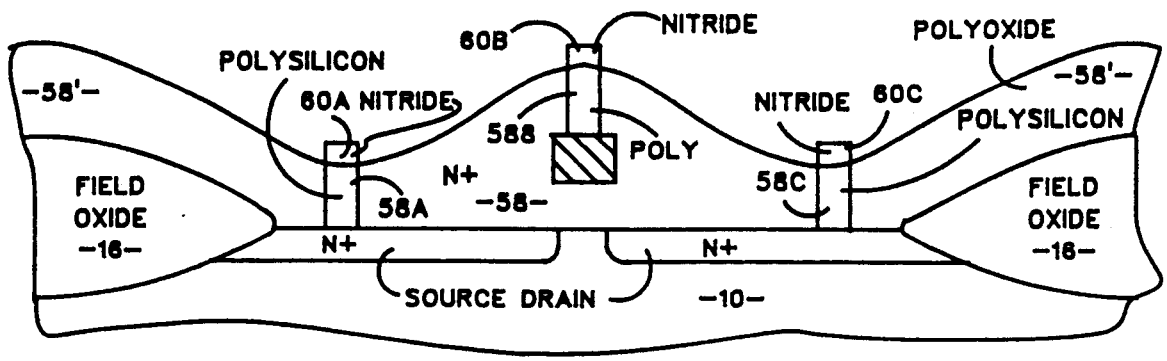
FIG. 8

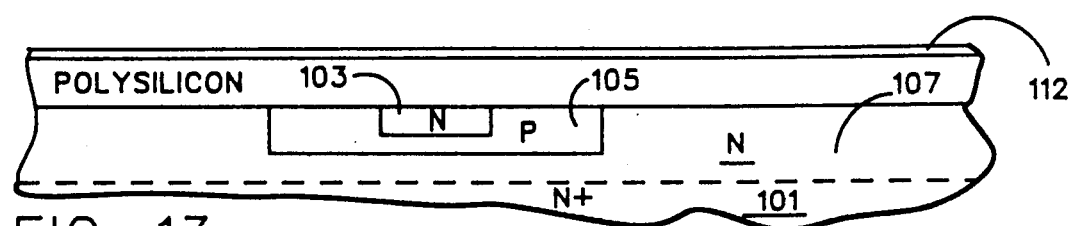
FIG. 13
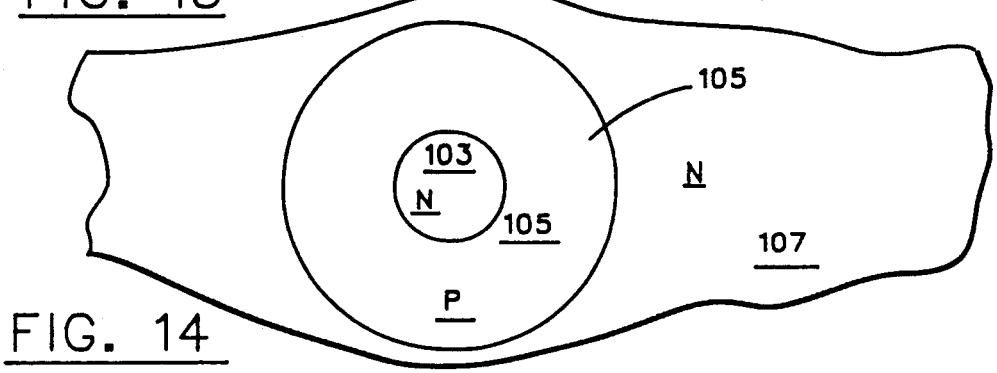
FIG. 14
FIG. 14A
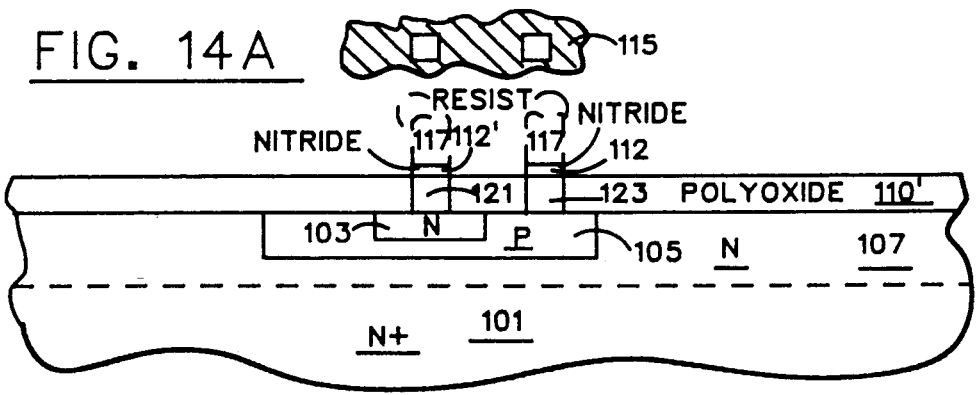
FIG. 15
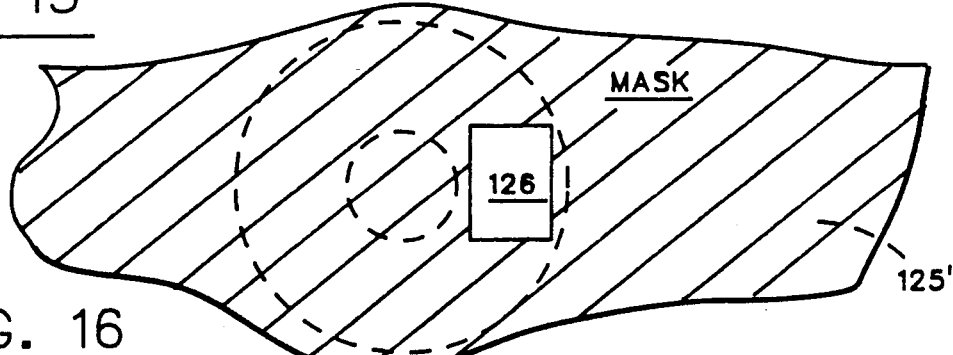
FIG. 16
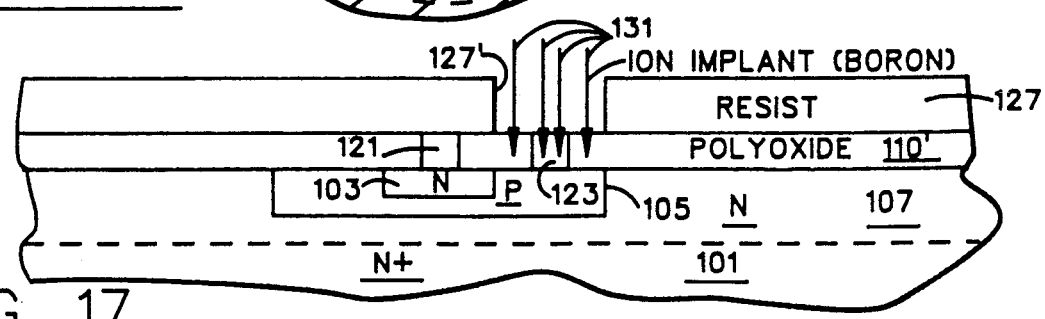
FIG. 17

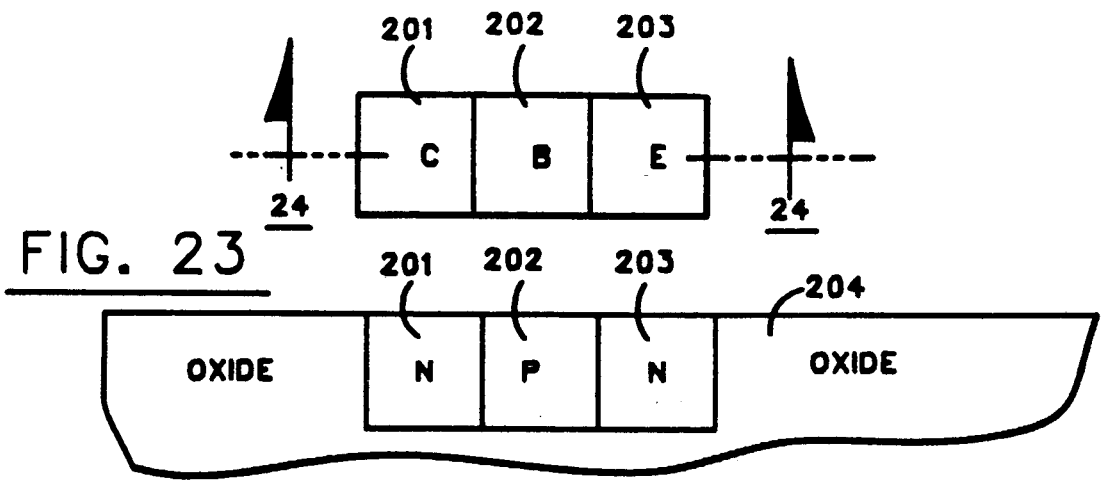
FIG. 23
FIG. 24
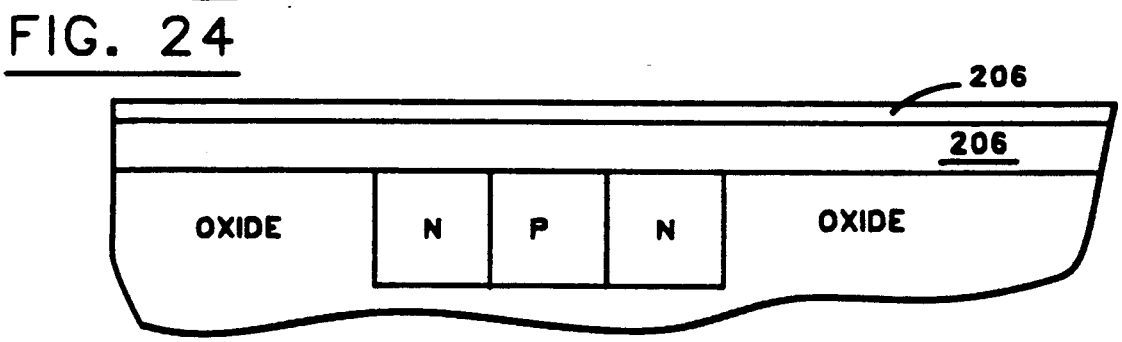
FIG. 25
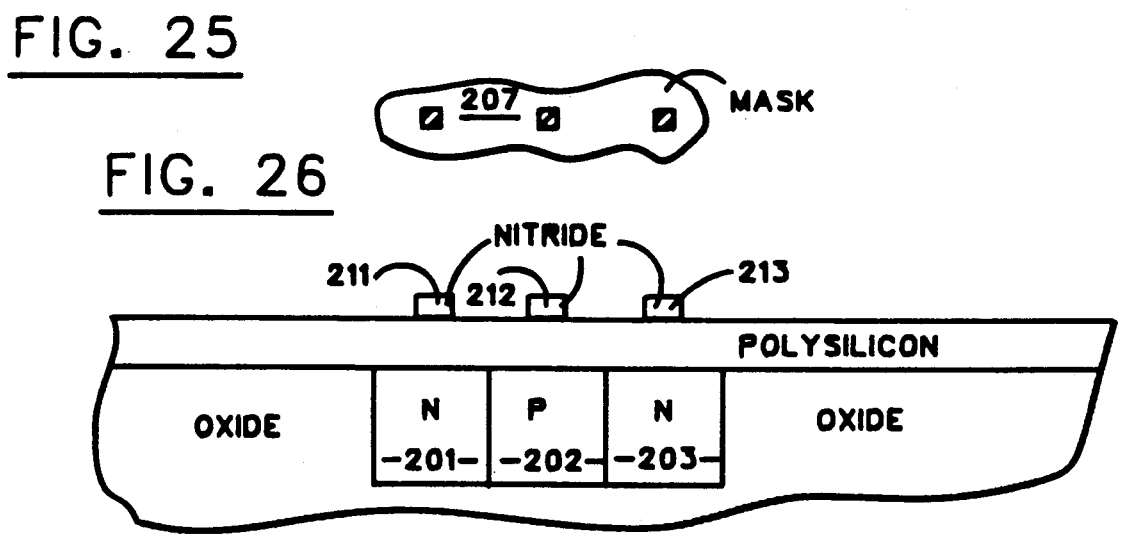
FIG. 26
FIG. 27
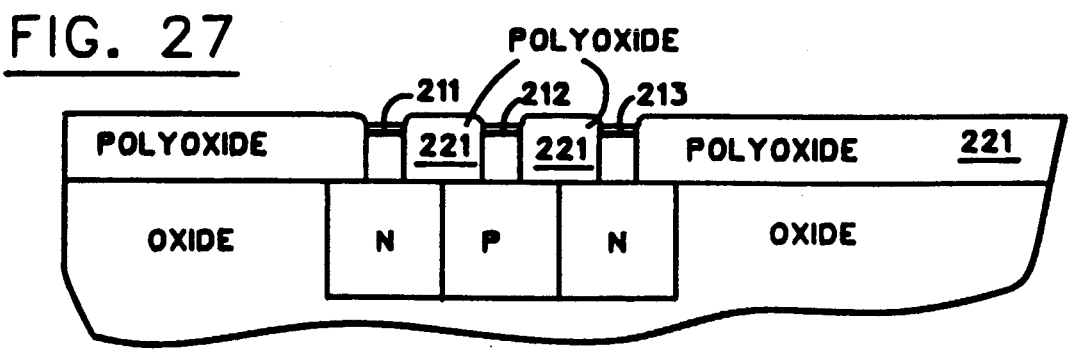
FIG. 28

SUB-MICRON BIPOLAR DEVICES WITH SUB-MICRON CONTACTS

CROSS REFERENCE

This application is a divisional continuation-in-part of my U.S. patent application Ser. No. 073,591, filed July 15, 1987, and entitled Sub-Micron Devices with Method For Forming Sub-Micron Contacts.

FIELD OF THE INVENTION

The invention provides sub-micron VLSI devices, particularly of the conventional bipolar type, with preferably sub-micron contacts.

BACKGROUND OF THE INVENTION

A severe limitation for large scale integration is the lack of adequate registration from layer to layer during the fabrication process. These mis-registrations result in the introduction of guards/protections which enlarge the real estate area needed for a particular circuit layout.

In addition to registration problems, there is difficulty in preserving dimensional control when etching contacts or vias.

Another problem is caused by the steep walls generated during the making of conventional contacts/vias. Etching steps result in discontinuities of metal lines. Furthermore, metal has the propensity for spiking through shallow junctions forming sources and drains. As dimensions reach the sub-micron sizes, the problems mentioned above exacerbate exponentially.

SUMMARY OF THE INVENTION

A novel way of solving these problems is presented herein. By selectively oxidizing a single layer of polysilicon, contact sizes down to the order of 0.1 by 0.1 microns or 0.1 micron diameter can be realized.

The invention can be applied to MOS (n-, p-, CMOS), Bipolar, or GaAs devices. In general, once the diffusion regions have been formed, an oversized contact mask is applied and the insulating layer (oxide) etched so as to expose the substrate material or that to be accessed. Next, a layer of undoped polysilicon is deposited; here, the thickness of this polysilicon layer must be selected according to the desired size of the contact to be fabricated, and planarization of the insulation desired. For instance, for a contact size of 0.1 by 0.1 microns, the layer of polysilicon can be approximately 1000 angstroms. Then, a thin layer of silicon nitride is deposited on top of the polysilicon. With the aid of the contact mask, nitride contact buttons are delineated with photoresist. Next, the underlying layer of unprotected nitride is selectively etched, the photoresist is removed and the exposed polysilicon is oxidized. The nitride buttons protect the polysilicon underneath, hence preventing oxidation. The nitride is selectively removed from the contact areas. Next, the proper doping is performed by ion implantation and photoresist masking steps. Then, a layer of metal is deposited over the entire wafer, patterned with the aid of a metallization mask over a photoresist layer; the metal is etched and the photoresist is removed. Then, the devices are sintered to complete the fabrication process.

Alternatively, in lieu of oxidizing the polysilicon, the poly contact whiskers may be covered with low temperature oxide, followed by a layer of SOG. The tops of the poly whiskers are uncovered for doping of the contacts, as above. Another option is the forming of a large area of silicide across the bipolar element (i.e.) base, emitter (and collector) underneath its contact to make available a much larger number of atoms to give up electrons for electrode current, as in FIGS 55-68, claimed herein.

BRIEF DESCRIPTION OF THE DRAWINGS

FIG. 5 is an overview of the opened contact openings in the structure as seen in top plan view;

FIG. 6 is a mask for developing nitride buttons over the contact regions;

FIG. 7 shows the resist being retained in the three contact areas over the nitride layer;

FIG. 8 shows the nitride removed except where it was covered by the resist and the polysilicon converted to polyoxide except in the electrode regions protected by the nitride buttons;

FIG. 13 shows the steps for commencing the fabrication of the small contacts by employing a layer of polysilicon covered by a layer of nitride;

FIG. 14 shows the device of FIG. 13 in top plan view;

FIG. 14A is a mask for retaining resist over nitride button areas for contacts to the collector and base regions;

FIG. 15 shows the nitride buttons protected by the resist with the nitride layer otherwise removed and a portion of the polyoxide removed, the polysilicon having been converted to polyoxide where uncovered by the nitride removal;

FIG. 16 shows the mask for opening the contact region for the base;

FIG. 17 shows the ion implanting of boron ions through this opening into the base contact region to dope the polysilicon base electrode;

FIG. 23 is a view in top plan of a bipolar device of the Soclof type;

FIG. 24 shows the device of FIG. 23 in cross-section in field oxide;

FIG. 25 shows the application of a polysilicon layer covered by a nitride layer to the structure of FIG. 24;

FIG. 26 shows a contact mask;

FIG. 27 shows the nitride buttons remaining over each of the bipolar elements atop the polysilicon layer;

FIG. 28 shows the polysilicon layer converted to polyoxide except where the nitride buttons preserve the polysilicon;

DESCRIPTION OF THE PREFERRED EMBODIMENT

Figure 1:
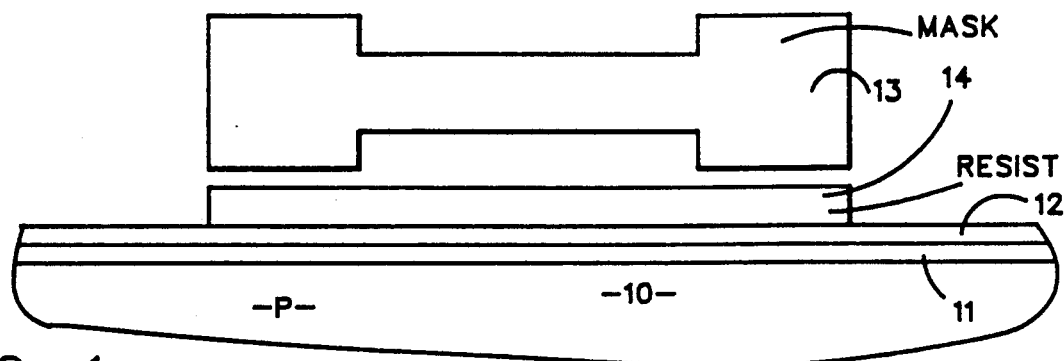
FIG. 1 is a view of the active region mask relative to a wafer with a layer of oxide and nitride as a conventional step in surrounding the active region with field oxide.
Figure 2:
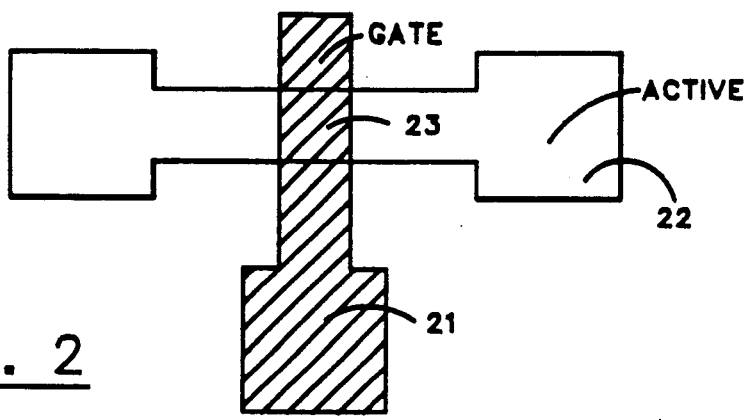
FIG. 2 shows the polysilicon delineated for the gate.

The steps shown in FIGS. 1 through FIG. 2 are conventional steps leading to the structure of FIG. 2 wherein processing is directed to the fabrication of the sub-micron contacts.

Thus, in FIG.1, P doped silicon wafer 10 is first thermally oxidized to produce the silicon oxide layer 11, followed by a deposit of nitride layer 12, and the use of active regions mask 13 to delineate photoresist 14 over the nitride layer 12.

Figure 1A:
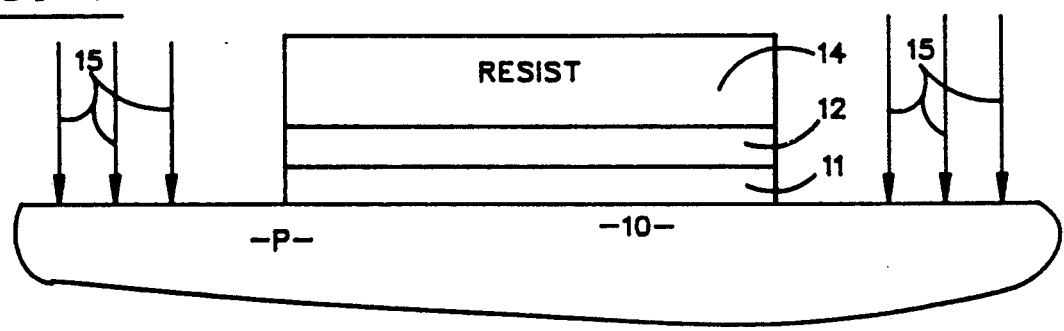
FIG. 1A shows the removal of the oxide and nitride from the regions other than the active areas.

The resist 14 permits etching away of the nitride layer 12 and oxide layer 11 everywhere except in the protected active region in order to provide for the field implant, shown as the boron ions implanted into the wafer 10 everywhere except in the active regions, as best seen in FIG. 1A. A 70 Kev implant is used at a dose of $8 \times 10^{12}$ ions/cm$^2$.

Figure 1B:
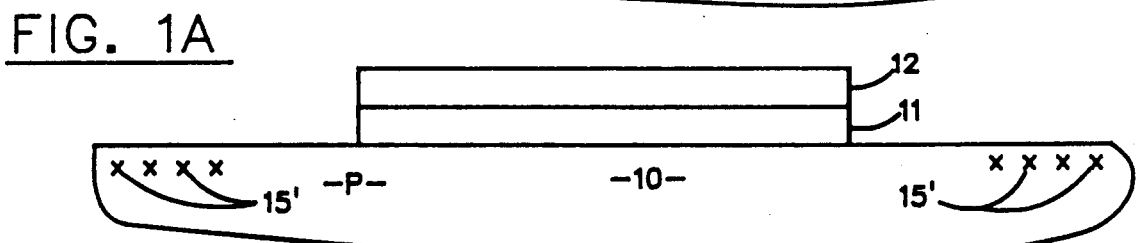
FIG. 1B shows the nitride layer to be used as the mask during oxidation.

In FIG. 1B, the resist 14 has been removed and the ion implant is illustrated at 15'.

Figure 1C:
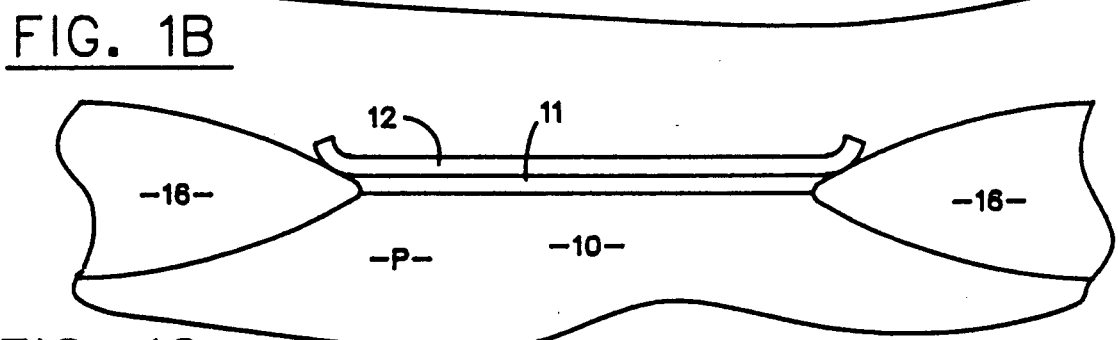
FIG. 1C shows the field oxide grown.

In FIG. 1C, the field oxide 16 is grown using the nitride layer 12 to prevent oxidation in the active region.

Figure 1D:
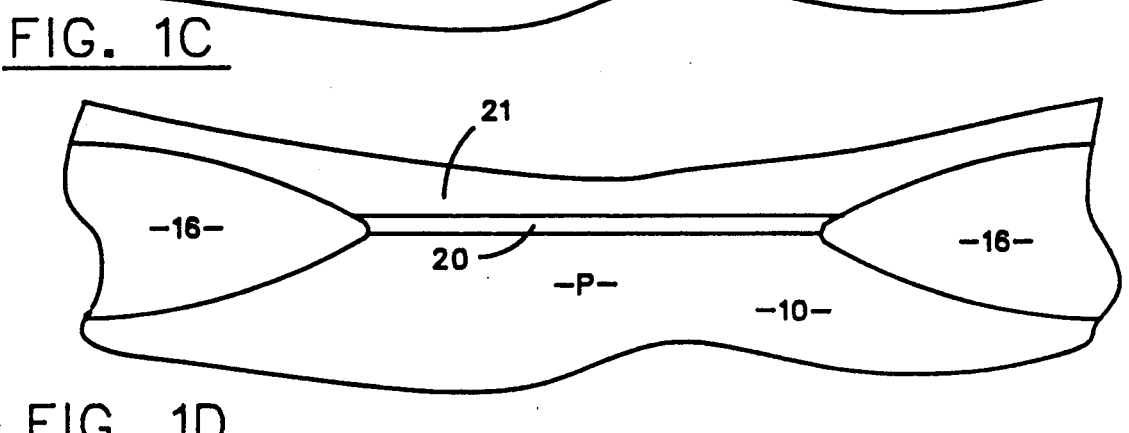
FIG. 1D shows the layer of polysilicon over the oxidized wafer and field oxide.

Next, the nitride layer 12 and oxide 11 are stripped, followed by growing gate oxide 20 in FIG. 1D.

In FIG. 1D, a layer of deposited polysilicon 21 is shown over the gate oxide 20.

FIG. 2 shows the structure after employing a gate mask to delineate the polysilicon 21 relative to the active region 22. The polysilicon 21 forms the gate electrode 23.

Figure 3:
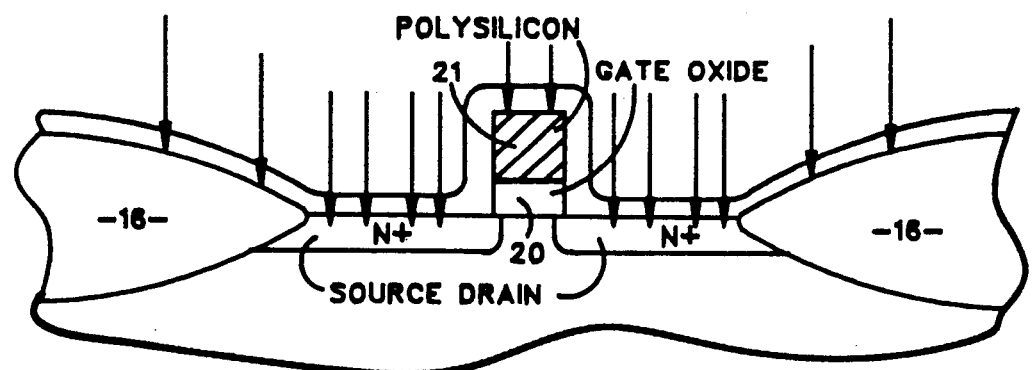
FIG. 3 shows source and drain activation by phosphorous implant.

In FIG. 3, the first step of growing a thin oxide layer 25 of approximately 200 to 600 angstroms thick is pursued toward delineating the contacts.

Figure 4A:
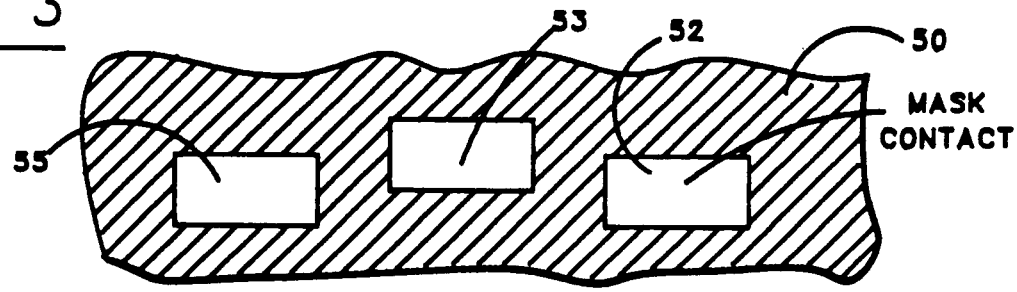
FIG. 4A shows a contact mask.
Figure 4:
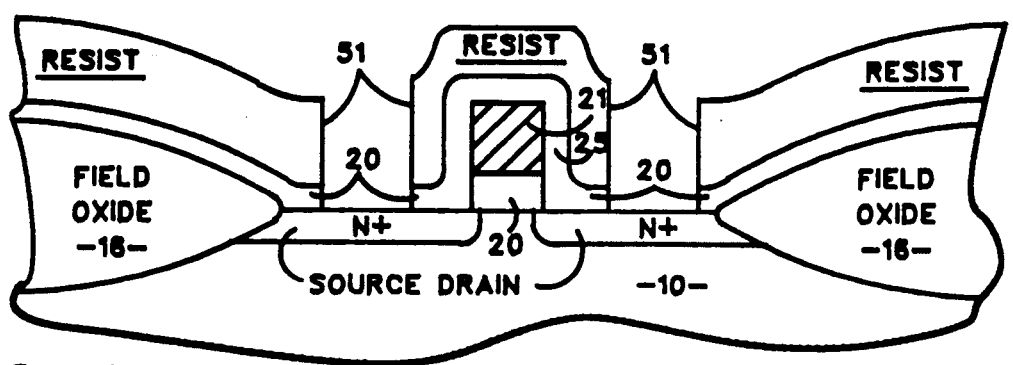
FIG. 4 shows the structure after extra large contact apertures have been opened to the bare silicon.

FIGS. 4 and 4A show the wafer 10 opened to bare silicon by contact mask 50. Photoresist 51 is applied over the structure of FIG. 3 and mask 50 is used to open both the photoresist 51 and the oxide 20 in the source and drain region. These contact regions are made extra large in order that registration errors may be minimized in arriving at the final product. The opening 53 in mask 50 is illustrated in FIG. 5 for the gate contact region 53, source opening 55 being designated by the left opening in contact mask 50 and drain opening designated by the right aperture 57.

In FIG. 7, an N+ doped polysilicon layer 58 is deposited on the previous structure to a thickness of approximately 2000 angstroms for fabricating contacts of the order of 0.1 microns by 0.1 microns (thinner polysilicon can be used for even smaller contacts). In general, for optimum results, 5000 angstroms of polysilicon may be used for contacts over 3 microns, 3000 angstroms for contacts of 1½ microns and 1000 microns for contacts of the order of 0.1-0.2 microns. Depending upon the equipment available and the level of skill of the operators, these figures may require slight adjustment, but they may be extrapolated and successfully used for an initial run.

However, in the cases where it is necessary to etch half of the polysilicon layer away, prior to oxidation in order to maintain planarization, the polysilicon thickness is simply doubled, (i.e.) 1000 angstroms becomes 2000 angstroms.

The next step is to deposit nitride 60 to a depth of about 1000 angstroms.

Then the contact mask 61 of FIG. 6 is employed to delineate the protective resist 62 over the source, resist 63 over the gate, and resist 64 over the drain.

The next step is to etch the nitride layer 60 and approximately one half of the polysilicon while the three regions are protected by the photoresist. This is achieved by employing an anisotropic etch conventionally to remove one half of the polysilicon and all of the unprotected nitride, the buttons being protected by the resist. Then, the resist is stripped and the unprotected polysilicon 58 is oxidized to become oxide 58'. Nitride buttons 60A, 60B and 60C cover the unoxidized polysilicon 58 over the source, gate and drain.

Figure 9:
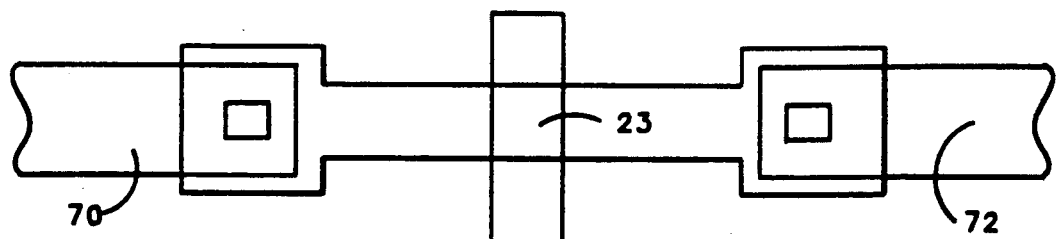
FIG. 9 is a view in plan of the interconnects and contact regions.
Figure 10:
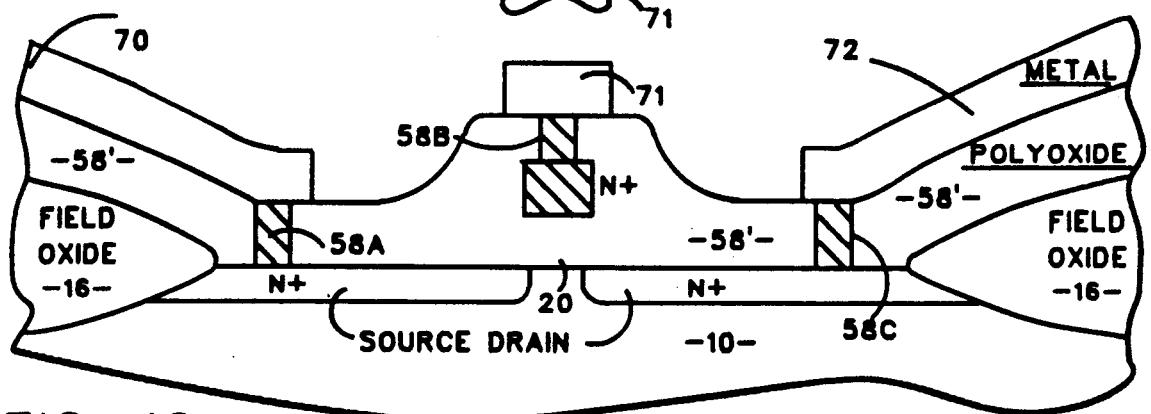
FIG. 10 shows the completed device with the sub-micron contacts.

FIGS. 9 and 10 show the finished NMOS device. In the structure of FIG. 8, the nitride buttons 60A, 60B and 60C are stripped thereby leaving the polysilicon 58A source electrode, polysilicon 58B gate electrode and polysilicon 58C drain electrode in the polyoxide 58'.

The next step is to deposit aluminum silicon followed, by masking the metal to delineate the source conductor or interconnect 70, gate interconnect 71 and drain interconnect 72.

In the prior art, the minimum overlap of active region (active mask 13, FIG. 1 and contact regions, FIG. 5) relative to contact (electrode areas 58) had to be at least 0.8 microns. But, in the present invention, since the electrodes 58 are doped with the same material as the source and drain junctions (N+) being connected, there is no possibility for the metal interconnect to short circuit from junction to substrate, as is the problem with the prior art resulting in the requirements for large area overlap.

The electrodes, being polysilicon, prevent the metal from spiking through shallow junctions (i.e.) sub-micron type junctions.

The contacts (electrodes) are of the order of 0.1 microns because:

(a) photoresist and nitride delineate the electrodes, (b) electrode integrity is maintained by rapid oxidation of the surrounding polysilicon while the polysilicon under the nitride button is preserved, and (c) in the event irregularities are encountered, larger contacts may be employed, such as 0.3 microns, to leave an effective contact size of 0.1 microns.

These factors are common to all oxidized embodiments of this invention.

In FIGS. 6 and 7, significant steps are illustrated for making the sub-micron contacts. It is necessary that the polysilicon 58 make contact with the already formed sources and drains because the delineated electrodes 58A and 58C are polysilicon which is covered by the nitride buttons 60A and 60C. The dimensions of these electrodes is established by the solid regions of mask 61. The masks are used for larger sizes. For smaller sizes, the E-beam is blanked out for these regions when making contacts down to 0.1 by 0.1 microns under computer control. Many current E-beam micro-fabricators have spot sizes down to 0.1 microns, or less.

Thus, oxidation of the polysilicon unprotected by the nitride buttons fixes these sub-micron contact area.

These techniques obtain throughout all oxidized embodiments presented herein.

The closet known prior art is U.S. Pat. No. 4,237,051 which discloses techniques for manufacturing a Totally-Self-Aligned Transistor; here, gates, contacts, and active areas are aligned to each other as a result of induced self-alignment during fabrication.

The present invention and this patent are both assigned to the same entity, and the subject inventor is a co-inventor of the patent.

The present invention improves over the patent by a technique which eliminates "sidewalk" effects by creating a flat field, thus, eliminating the "111" transition region from active to field regions. Also, overlap of gate electrode over field regions is totally eliminated by routing gate electrode metal interconnect by running it over the source or drain, thus inducing radiation hardness. This is particularly desirable in sub-micron devices for general use by the military, and in commercial space applications.

Figure 11:
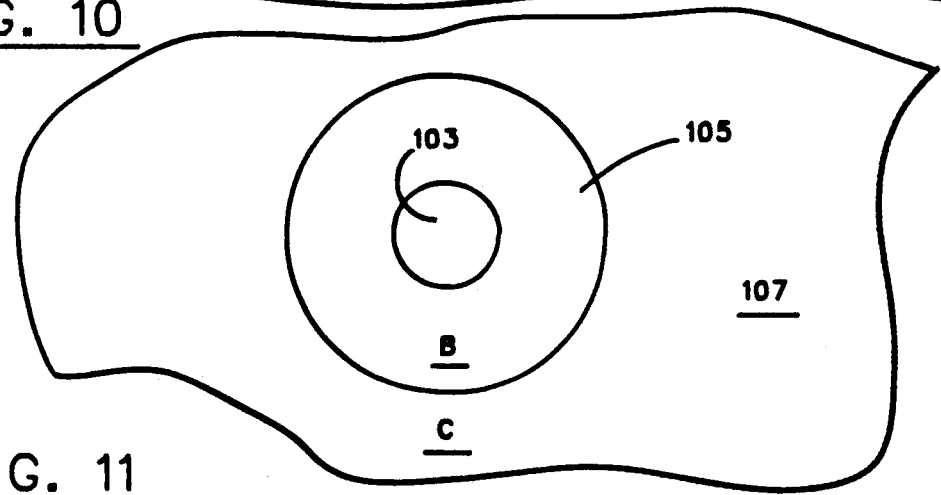
FIG. 11 is a view in top plan of a conventional bipolar device constructed to the stage of FIGS. 11 and 12 by conventional means.
Figure 12:
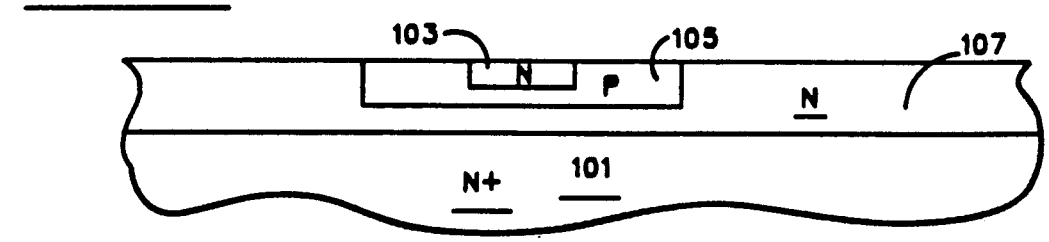
FIG. 12 is a view in cross-section of the bipolar device.

FIGS. 11 and 12 illustrate a conventional bipolar transistor structure wherein the wafer 101 is doped N+ and the emitter 103 is defined and diffused with n-type dopant, the base 105 is similarly defined and diffused with p-type dopant and the collector 107 is doped n-type.

This basic structure can be produced by any of the conventional processing techniques to this stage ready to receive the sub-micron contacts through processing steps described hereinafter.

In FIG. 13, a layer of undoped polysilicon 110 is deposited over wafer 101 with a layer of nitride 112 deposited over the polysilicon layer 110. The thickness of the polysilicon layer 110 is preferably 2000 angstroms (for 0.2 micron contacts) approximately and the thickness of the nitride layer 112 is approximately 1000 angstroms.

The next step is to mask the contact regions using contact mask 115 of FIG. 14A to retain photoresist 117 over nitride buttons 112' and 112'' for the emitter 103 contact and the base 105 contact. This permits anisotropic etching to be carried on conventionally to remove approximately one half of the polysilicon thickness and all of the nitride, except where protected by photoresist 117, i.e., the buttons.

After the resist 117 is stripped, the polysilicon 110 is oxidized into polyoxide 110'. It should be noted that approximately half or 1000 angstroms of the polysilicon 110 was etched away, along with the nitride 112, such that when the polysilicon is oxidized into polyoxide 110', the level of the top is approximately coplanar to the original level of the top of the polysilicon 110. However, at the start of oxidation, the thickness of the polysilicon was 1000 angstroms to produce 0.1 micron contacts.

The nitride contact buttons 112' and 112'' are etched away because they have served their purpose of protecting the polysilicon electrode regions 121 and 123 for the emitter 103 and base 105 from oxidation when the polysilicon layer 110 was coverted to polyoxide 110'.

Figure 18:
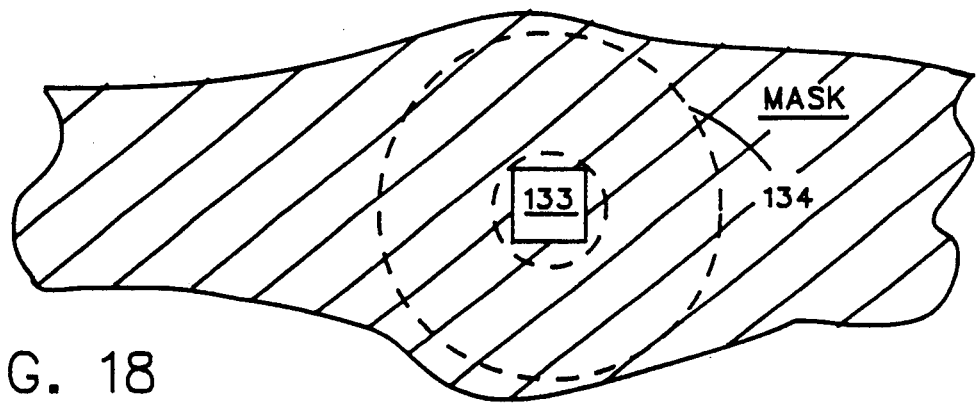
FIG. 18 shows the mask for opening the contact region over the collector electrodes.
Figure 19:
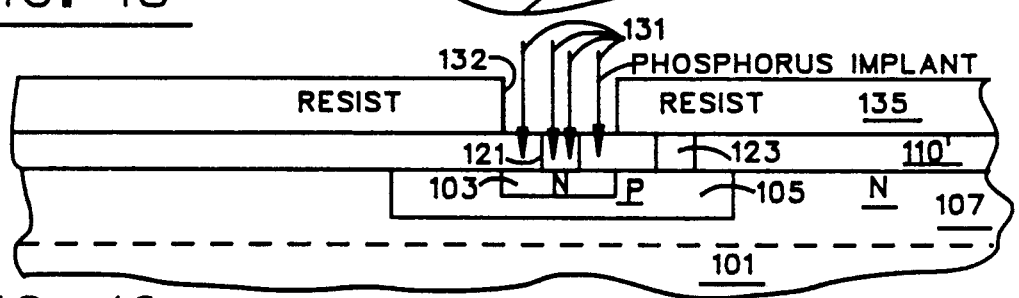
FIG. 19 shows this region opened and phosphorus implant taking place to dope the polysilicon collector electrode.
Figure 20:
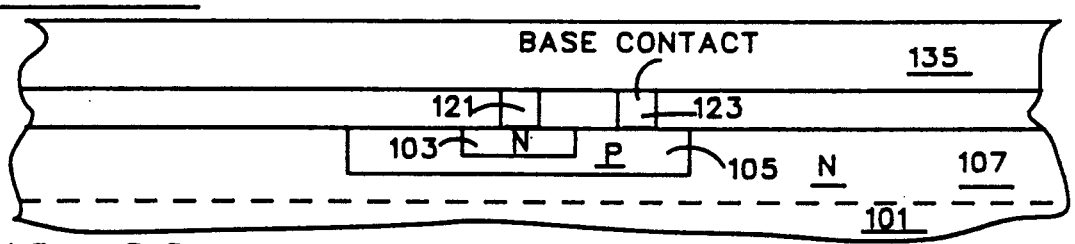
FIG. 20 shows a layer of metal applied over these two electrodes.
Figure 21:
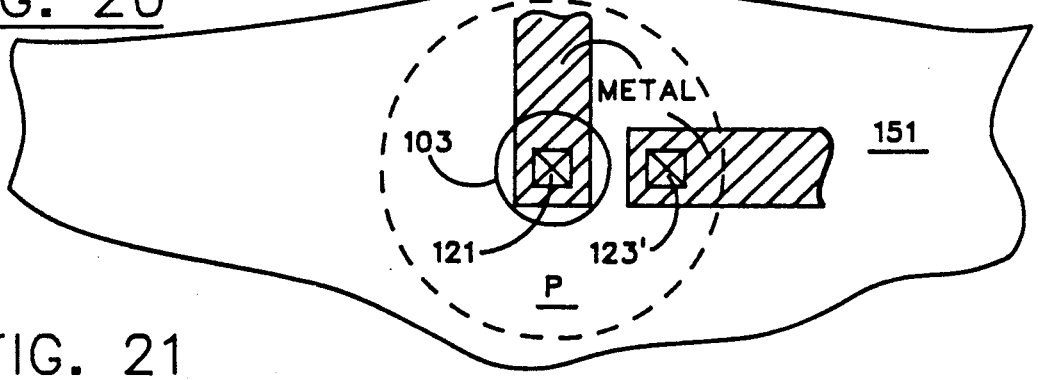
FIG. 21 shows a metal contact mask.

The next step is to mask the P contact region by empolying mask 125' with opening, 126 as shown in FIG. 16. Thus, the photoresist 127 is opened in the aperture 127' and boron ions are implanted, as shown by the arrows 131 using a 60 Kev implanter with a dose of 1 to $5 \times 10^{15}$ ions per cm$^2$. Thereafter, the resist 127 is stripped and the mask of FIG. 18 is employed in similar manner to implant phosphorus ions, shown by the arrows 131 into the N contact region represented by the aperture 132 produced by the aperture 133 in mask 134 of FIG. 18. To implant this N+ contact, a dose of 1 to $5 \times 10^{15}$ ions per square centimeter is preferred. Thereafter, the resist 135 is stripped and the implants are annealed at 800° C. for 40 minutes in nitrogen.

Figure 22:
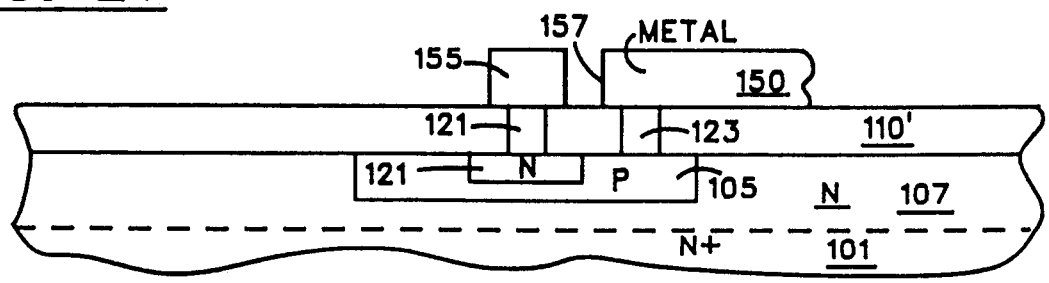
FIG. 22 shows the completed device with the metal interconnects for the two contacts.

The next step is to deposit metal, interconnect 150, FIG. 22 represents this layer of metal which is covered with photoresist and exposed through the mask 151 for etching to leave the emitter contact 155 and base contact 157 on the polyoxide layer 110' and in contact with the emitter electrode 121 and the base electrode 123, respectively.

Following stripping of the resist, the device is sintered for a completed product.

The actual contact regions are shown by the squares marked 121' and 123', visible in the mark 151. These contact regions may be of the order of 0.1 by 0.1 microns per contact.

In FIG. 23, a plan view of a Soclof bipolar transistor is shown, as described in U.S. Pat. Nos. 4,415,371, METHOD OF MAKING SUB-MICRON DIMENSIONED NPN LATERAL TRANSISTOR, Nov. 15, 1983; 4,437,226, PROCESS FOR PRODUCING NPN TYPE LATERAL TRANSISTOR WITH MINIMAL SUBSTRATE OPERATION INTERFERENCE, Mar. 20, 1984; 4,522,682, METHOD FOR PRODUCING PNP TYPE LATERAL TRANSISTOR SEPARATED FROM SUBSTRATE BY O. D. E. FOR MINIMAL INTERFERENCE THEREFROM, June 11, 1985; 4,580,331, PNP-TYPE LATERAL TRANSISTOR WITH MINIMAL SUBSTRATE OPERATION INTERFERENCE AND METHOD FOR PRODUCING SAME, Apr. 8, 1986.

In these transistors the collector, base, and emitter 201, 202 and 203 comprise substantially the transistor, there being field oxide 204 about each device.

In FIG. 24, the collector is shown as being N doped, the base P doped, and the emitter N doped.

The bipolar transistors may be manufactured to the stage shown in FIG. 24, in accordance with the process of any one of the Soclof patents.

The first step in building sub-micron contacts for these devices is to deposit undoped polysilicon to approximately 2000 angstroms. This layer is shown at 205 and, again, if the contacts are to be larger more polysilicon can be used.

A layer 206 of nitride is deposited to a thickness of approximately 1000 angstroms, as thus shown in FIG. 25.

The mask 207 of FIG. 26 is employed with photoresist (not shown) to delineate the nitride 206, thereby leaving the nitride buttons 211, 212 and 213 over the collector 201, base 202 and emitter 203 respectively.

It is important to note that during the etch removal of the nitride, a portion of the polysilicon is also removed. This may comprise one half of the polysilicon so that 1000 angstroms of polysilicon is really used for 0.1 micron contacts. The nitride and polysilicon are removed by anisotropic etch over a predetermined conventional time period.

Next, the resist is stripped and the polysilicon oxidized to become polyoxide 221, shown in FIG. 28. The polyoxide 221 also fills in the spaces between the nitride buttons 211, 212 and 213 to insulate the contacts from each other.

Figure 29:
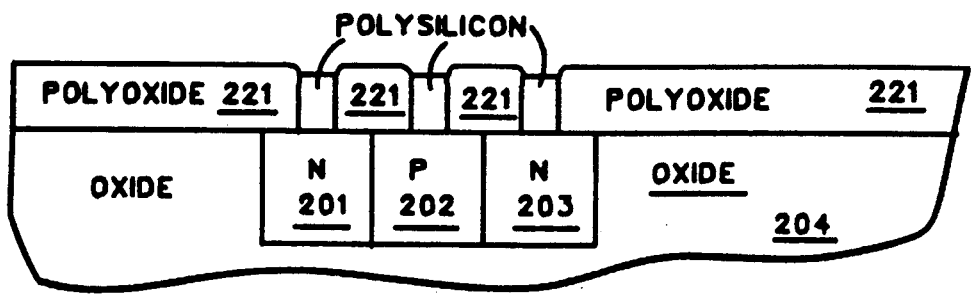
FIG. 29 shows the structure after removal of the nitride buttons.

FIG. 29 shows the structure after the nitride buttons 211, 212 and 213 have been removed by etching or stripping.

Figure 30:
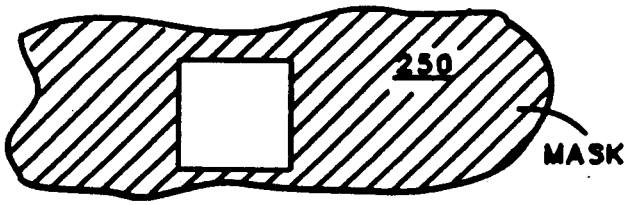
FIG. 30 shows the mask for activating the base electrode polysilicon.
Figure 31:
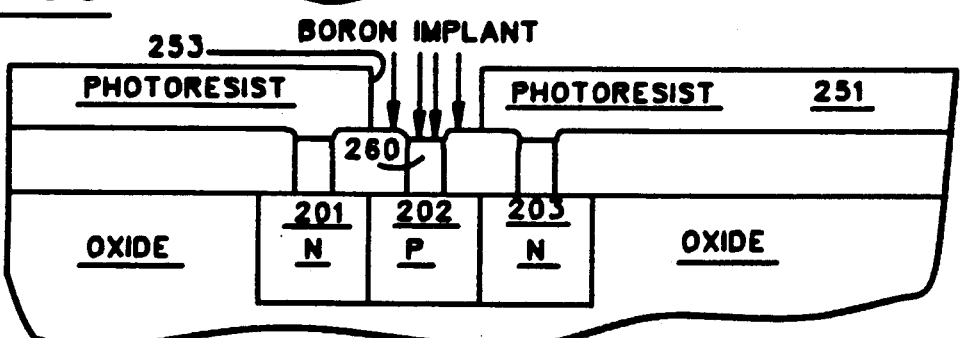
FIG. 31 shows the boron implant to achieve the doping of the polysilicon electrode.
Figure 32:
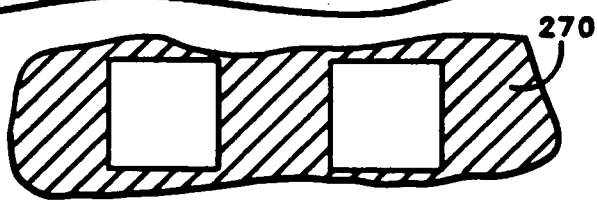
FIG. 32 shows a mask for opening regions to the collector and emitter (N regions)

In FIG. 30, mask 250 is used, together with photoresist 251 to open aperture 253 into the P doped base 202. For boron implanting into the base electrode 260 to make contact to base 202, implanting is carried out using a 60 Kev implanter with a 1 to $5 \times 10^{15}$ ions per cm$^2$ does.

Figure 33:
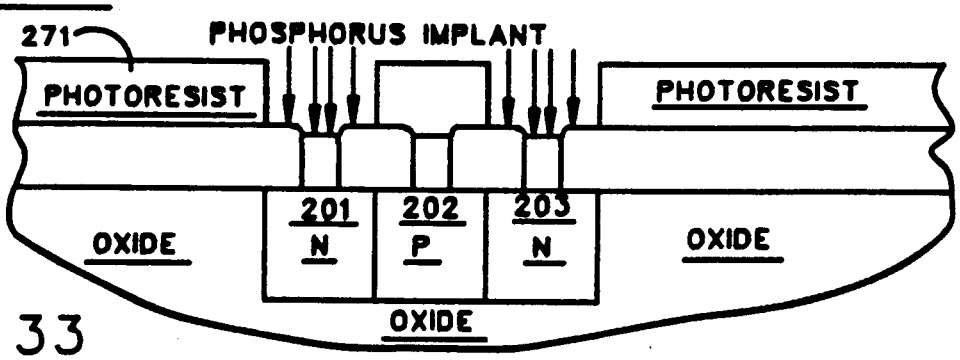
FIG. 33 shows these regions opened and the polysilicon therein being doped by phosphorus implant.

Next, the photoresist 251 is stripped and a new layer applied for use with the mask 270 to open the new layer of photoresist 271 above the collector 201, and emitter 203. The phosphorus ions are implanted, the photoresist 271 is stripped and the device of FIG. 33 is annealed for the implants at 800° C. for 40 minutes in a nitrogen atmosphere.

Figure 34:
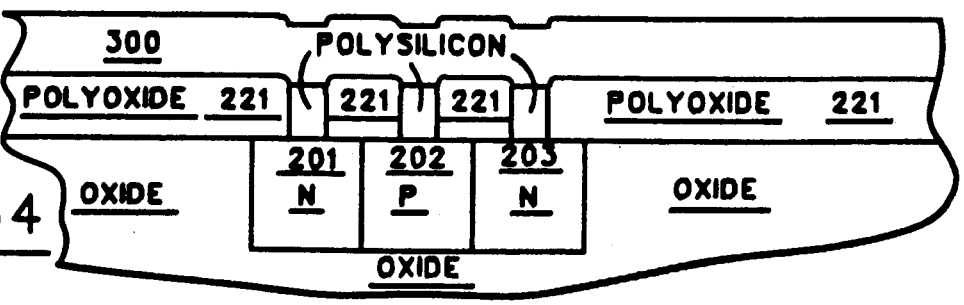
FIG. 34 shows the nitride buttons removed and the layer of metal over top of the structure.
Figure 35:
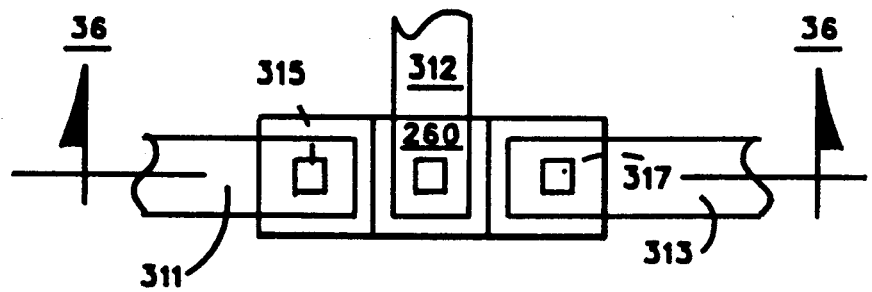
FIG. 35 shows the arrangement in top plan view as delineated by the mask of FIG. 36.
Figure 36:
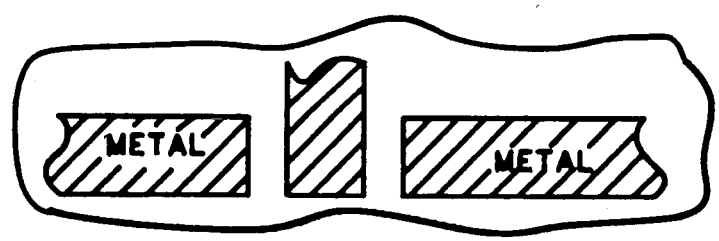
FIG. 36 is the mask of delineating the conductors 311, 312 and 313 of FIG. 35.
Figure 37:
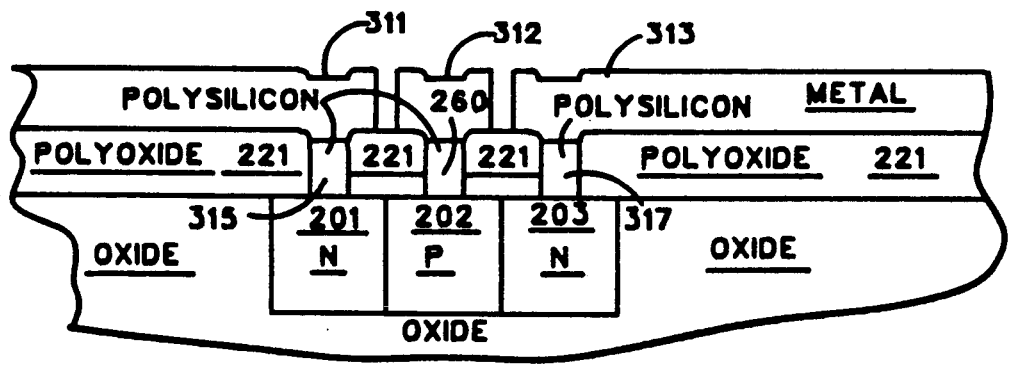
FIG. 37 shows the completed device following sintering.

In FIG. 34, a metal layer 300 has been applied over the structure, photoresist and the mask are applied and the metal is etched to provide a metal interconnect 311 (FIG. 35) to the collector 201, interconnect 312 to the base 202 and interconnect 313 to the emitter 203.

Figure 38:
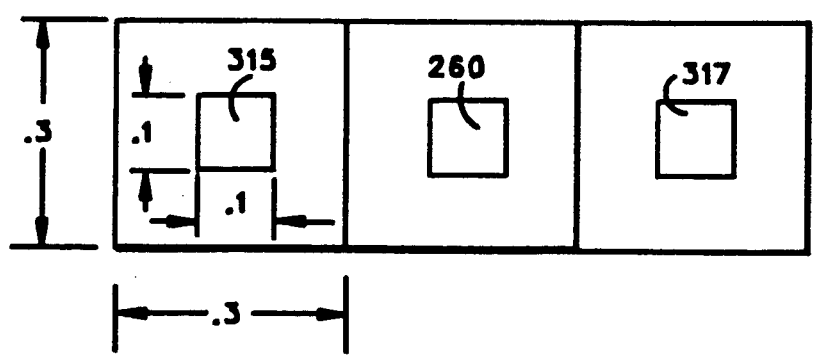
FIG. 38 shows dimensions achievable in the contact regions for these devices.

FIG. 38 shows relative sizes for the bipolar device, the elements themselves, such as the collector measuring 0.3 by 0.3 microns and the contact regions measuring 0.1 by 0.1 microns. The contacts can be oversized to approximately 0.3 microns and the elements may measure $0.9 \times 0.9$ microns. Of course, the principles disclosed permit 3 and 4 micron devices with (e.g.) 0.9–1.0 plus micron contacts if desired.

The use of an E-beam fabricator, guided by the masks successively used herein, makes the VLSI contacts of the order of these smaller dimensions. Of course, much larger contacts might be readily utilized on the larger devices. This technique is accomplished through the use of polysilicon which remains in the electrode areas, but is converted to polyoxide in the remaining areas with the nitride buttons guarding against oxidation of the polysilicon electrode areas.

If desired, single MOS or bipolar devices may be made, and it is only necessary to insulate them by isolation, usually in lieu of the field oxide, illustrated.

It should now be appreciated that the present invention provides the most minumal size Soclof type (totally lateral) bipolar devices attainable because they consist primarily of active elements. For the MOS and conventional bipolar, minimal size contacts are also obtained down to 0.1×0.1 microns, or to 0.1 micron diameter where the spot size is 0.1 micron or less.

Figure 39:
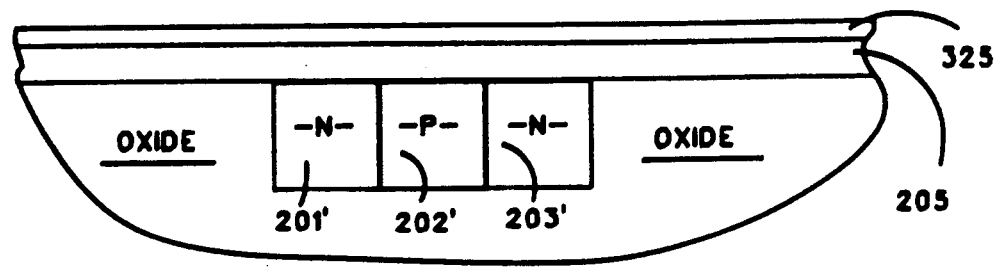
FIG. 39 shows the NPN elements of a transistor being formed embedded in oxide and covered by a layer of polysilicon, in turn covered by a layer of nitride.
Figure 40:
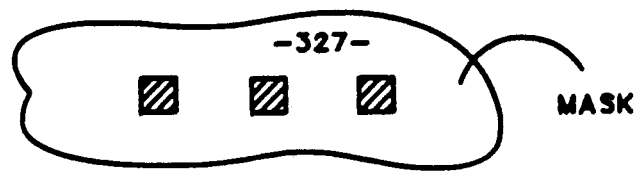
FIG. 40 is a contact mask.
Figure 41:
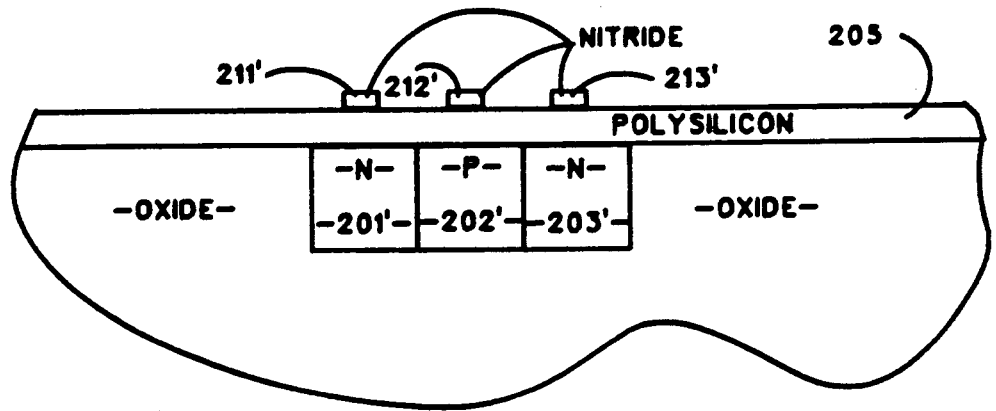
FIG. 41 shows the nitride contact buttons.

Yet another alternative method for forming the 0.1 to 0.9 micron contacts is disclosed, beginning with FIG. 39 wherein the three elements, collector 201' and emitter 203' are first covered by polysilicon 205' to a depth of, e.g., approximately 3000 angstroms, and nitride 325 is deposited to a depth of, e.g., approximately 1000 angstroms. Mask 327 (FIG. 40) serves to form the nitride buttons 211', 212' and 213' (the same as before). These nitride buttons 211'-213' are preferably centered over the collector 201', base 202' and emitter 203', as seen in FIG. 41, although considerable leeway is available for any misalignment, as is apparent from dimensional FIG. 53. The contacts of any of the previous embodiments may also be formed by this process.

Figure 42:
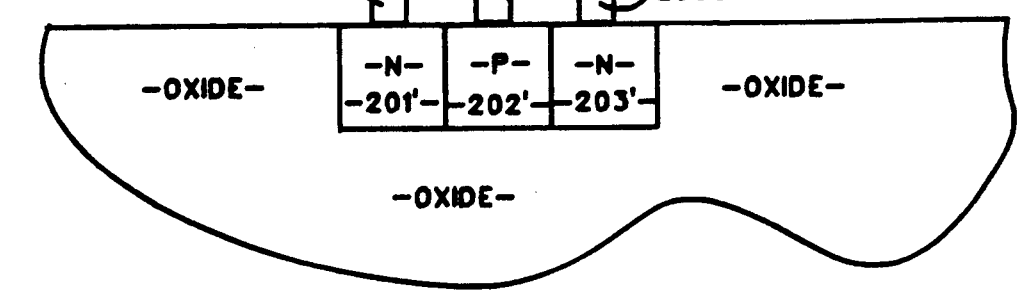
FIG. 42 depicts the isolated polysilicon contacts.

In FIG. 42, the unprotected polysilicon 205' has been removed in conventional manner, such as by etching to leave undoped polysilicon contacts 205a, 205b, and 205c".

Figure 43:
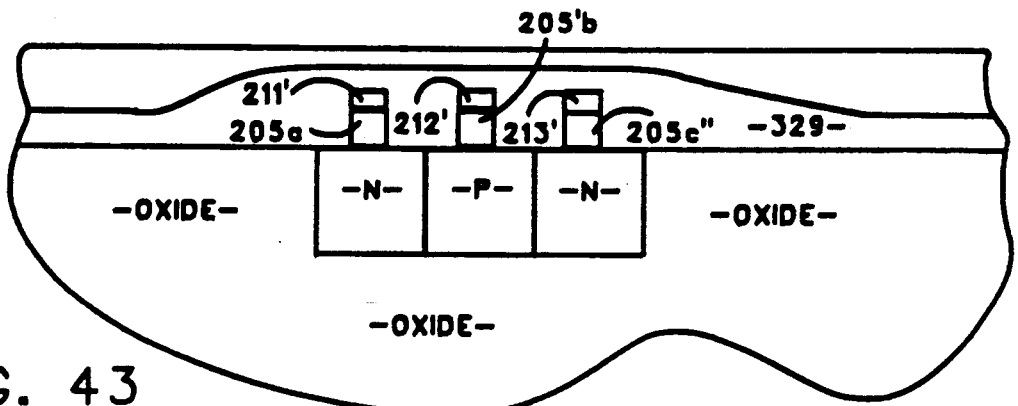
FIG. 43 reveals the plasma oxide covering the contacts, and in turn covered by glass (SOG)

In FIG. 43, plasma oxide 329 is deposited using the conventional planarization process to a depth of approximately 3000 angstroms. This step is followed by spin on glass 327 (SOG) so as to look substantially planar. Note here, layer 329 and 327 are both oxide compounds, but are never oxidized in this process.

Figure 44:
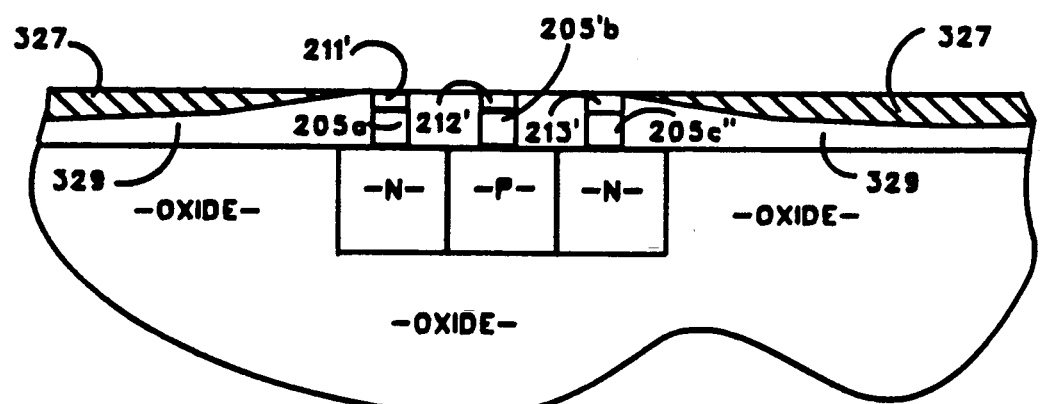
FIG. 44 planarizes the structure of FIG. 43 down to the tops of the nitride buttons.

In FIG. 44, a reactive ion etching (RIE) conventional step is carried out for effecting planarization which exposes the nitride buttons 211', 212' and 213' and is terminated approximately at the level of the tops of these buttons.

Figure 45:
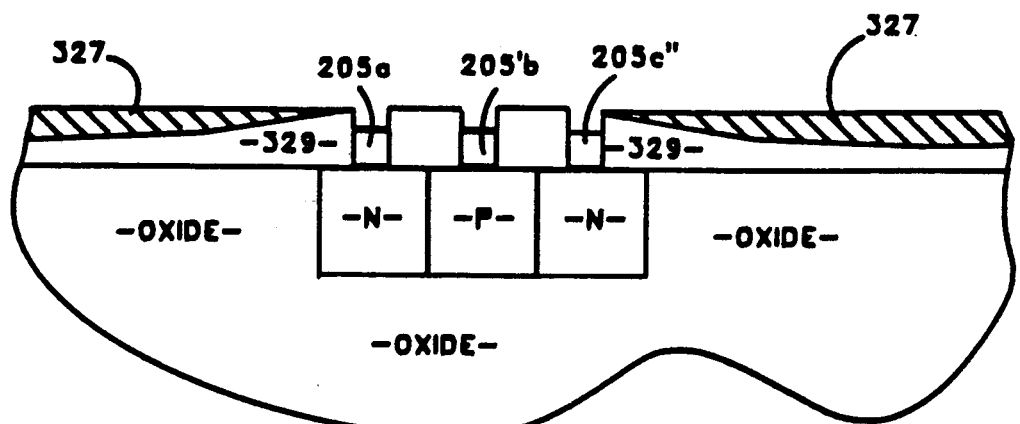
FIG. 45 shows the structure of FIG. 44 with the nitride buttons removed.

In FIG. 45, the nitride buttons 211', 212' and 213" have been removed from the contacts 205a, 205'b and 205"c using a conventional step to prepare the contacts for doping to make them properly conductive.

Figure 46:
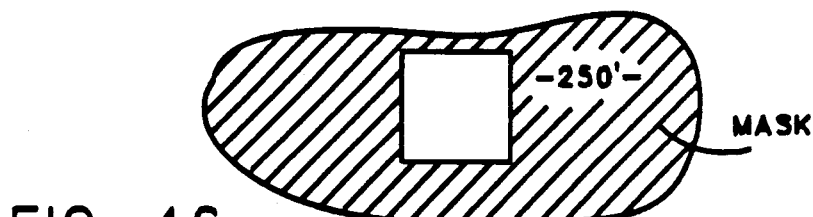
FIG. 46 shows the mask to be used in making a doping opening to the base contact.
Figure 47:
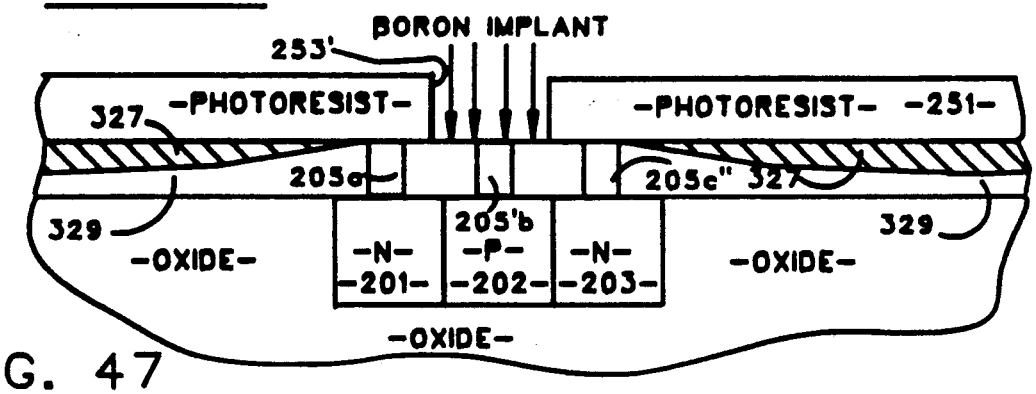
FIG. 47 shows the doping step for the base contact.

In FIG. 46, mask 250' is shown for delineating photoresist 251', in the previous manner, to provide the opening 253' for the boron implant, as shown by the arrows in FIG. 47.

Figure 47A:
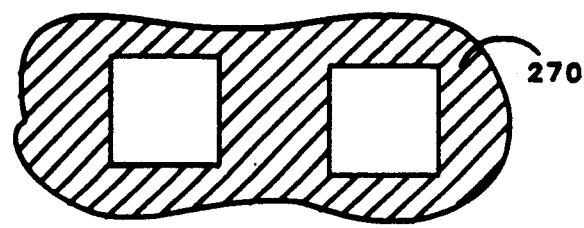
FIG. 47A shows a mask for making openings to the collector and emitter contacts.
Figure 48:
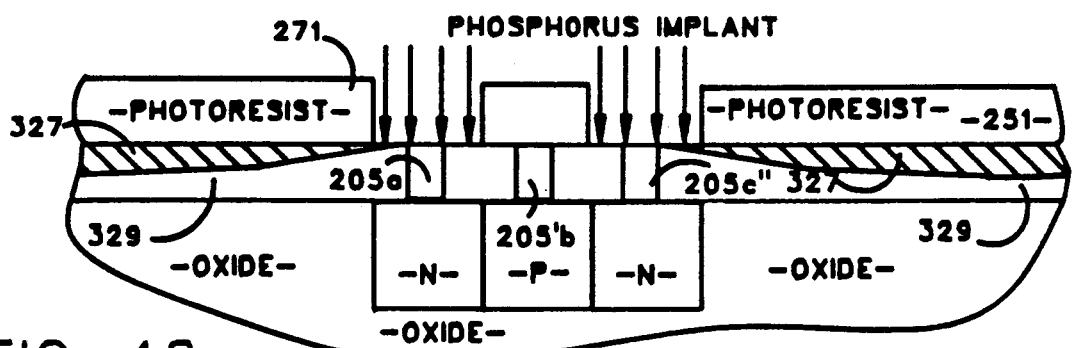
FIG. 48 shows the doping step for the collector and emitter contacts.

In similar fashion, mask 270' of FIG. 47A, is again utilized to delineate the photoresist 271 for the phosphorus implants, shown by the arrows (FIG. 48), thereby concluding the doping of the three polysilicon contacts 205, 205' and 205" in the same N or P doping as their underlying collector, base and emitter.

Figure 49:
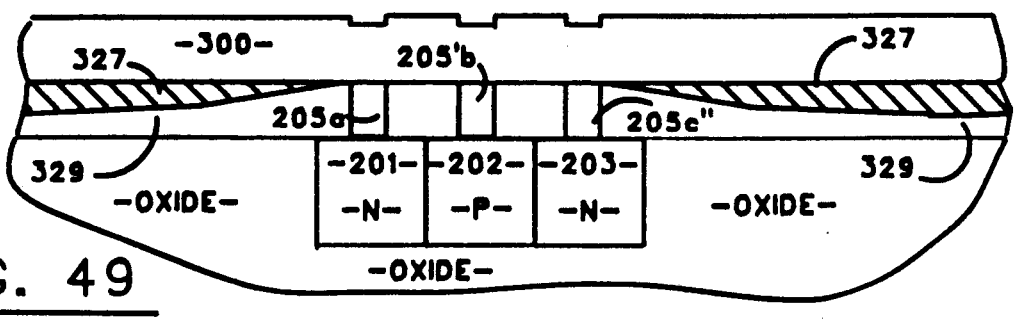
FIG. 49 includes the metal interconnect layer.
Figure 50:
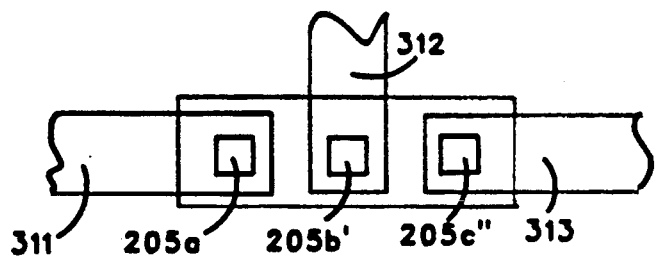
FIG. 50 shows the delineated metal interconnects.
Figure 51:
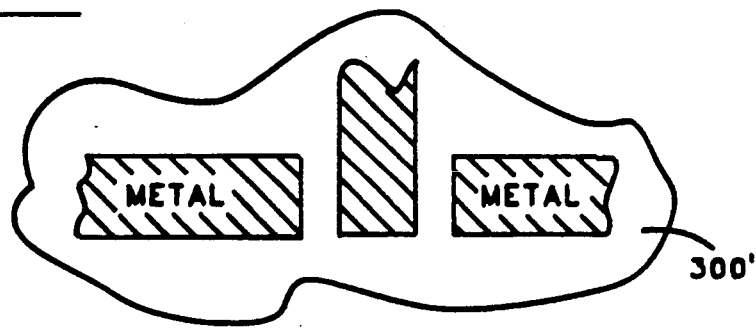
FIG. 51 shows the mask for effecting the delineation.

In FIG. 49, the metal layer 300 has been applied over this structure, and the metal mask of FIG. 51, shown at 300', is used, and the metal is etched to provide the metal interconnects 311 (FIG. 50, to the doped poly electrode 205a of collector 201, interconnect 312 to the doped poly electrode 205'b of the base 202 and interconnect 313 to the doped poly electrode 205"c of emitter 203.

Figure 52:
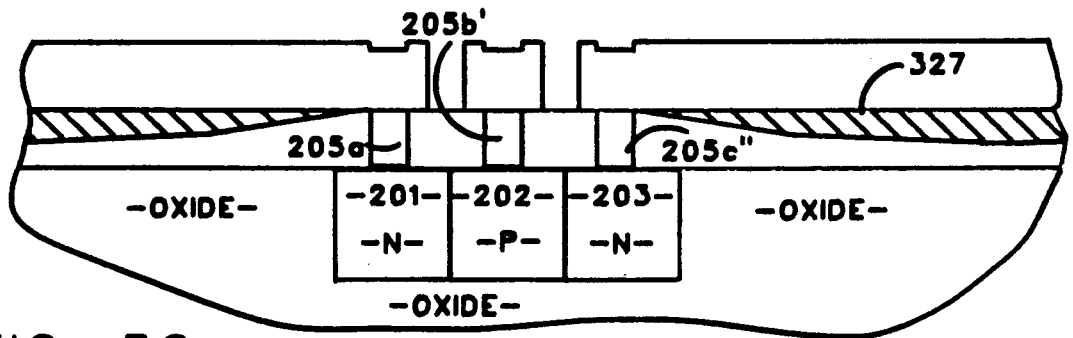
FIG. 52 shows the completed device.

FIG. 52 shows the completed device made in this fashion.

Figure 53:
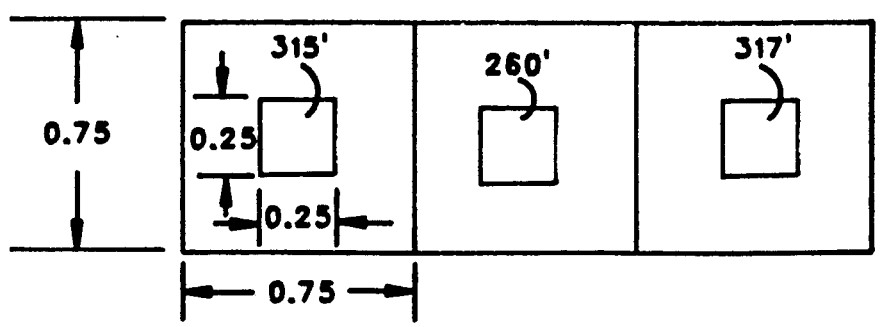
FIG. 53 is an example of relative sizes available from this method.

Finally, FIG. 53 shows, by way of example, relative sizes for the bipolar device, the elements themselves such as the collector measuring 0.75 by 0.75 microns and the contact regions measuring 0.25 by 0.25 microns. Of course, the effective dimensions of FIG. 38 may be achieved with this process, as well as dimensions of 3 to 4 micron devices.

The use of an E-beam fabricator, guided by the masks successively used herein, makes the VLSI contacts of the order of these dimensions. Of course, larger contacts might be readily utilized. This technique is accomplished through the use of polysilicon which remains in the electrode areas, but is surrounded by insulation in the remaining areas with the nitride buttons having guarded against destruction of the polysilicon electrode areas.

If desired, single MOS or bipolar devices may be made, and it is only necessary to insulate them by isolation, usually in lieu of the field oxide, illustrated.

This method is also applicable to MOS, GaAs and conventional bipolar minimal size contacts obtained down to 0.1×0.1 microns, or to 0.1 micron diameter where the spot size is 0.1 micron or less. The method also encompasses larger sizes even into 1 or 2 or more microns.

The principles of the present invention are compatible with use of 1:1 printer equipment for, e.g., 2 micron dimensions, the 10:1 stepper for, e.g., 1 micron rated dimensions, and electron beam or X-ray lithography for under 1 micron dimensions, all utilizing accepted existing registration and alignment techniques.

Conversely any irregularities in contact size where oxidation is involved can be compensated by adequate oversizing so as to render the final dimensions within target. For example, if birdsbeak were to consume 70% of silicon thickness, then to convert 2000 angstroms of polysilicon thickness to polyoxide, oversizing of the contact by approximately 0.14 micron on each side would be necessary to end up with 0.1 micron contact size after oxidation. This is achieved by use of a mask having 0.1+0.28 equal to 0.38×0.38 mask size; so the polysilicon left is 0.1. While this is not an exact science, compensation methodology is conventionally used in the industry.

One reason for developing contacts of the order of 0.1 microns is to enable a minute device to be produced (i.e.) the overall structure may measure 0.3 emitter width, plus 0.3 base width, plus 0.3 collector width— each 0.3 long with no waste spaces (i.e.) totally active device. In such a device, a contact on each element of the order of 0.1 micron leaves a spacing of 0.1 micron on all sides of the contact within the element—a layout now achievable. Particularly, in the military and in space carried packages, a real estate savings of this magnitude is highly desirable. Use of the polysilicon— low temperature oxide—SOG process readily admits of such unique dimensioning. (E-beam spot sizes of 0.1 micron and smaller are in standard use, today and when employed in these processes, such dimensioning is realizable).

In summary, the following advantages are achieved by this invention:
1. Sub-micron contact technology.
2. Contact integrity without the need of excessive silicon content in the metal or contact barriers such as titanium nitride, etc.
3. Planar structures without severe steps to hinder metal step coverage, or restrictions for proximity of contact to vias to gates thereby improving packing density.

4. Principle applicable to MOS (NMOS, PMOS, CMOS, etc.), bipolar devices and GaAs technologies.

5. Contact technology compatible with shallow junctions and other state of the art processes such as selective silicides.

6. Minimum overlap of metal for interconnects.

7. Via overlap of contact realizable with this technique.

DESCRIPTION OF PREFERRED BIPOLAR

The conventional bipolar device of FIGS. 11-22 readily admits of the spin on glass/low temperature oxide sub-micron contact method of FIGS. 39-52 with or without the silicide extended area contacts, as will now be described using FIGS. 54-68.

Figure 54:
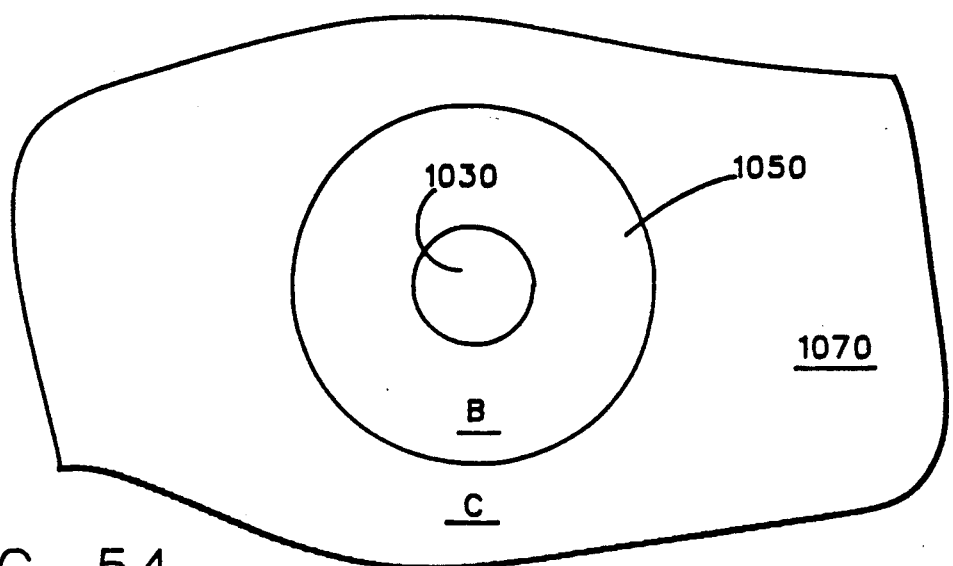
FIG. 54 is a view in top plan of a conventional bipolar device constructed to the stage of FIGS. 54 and 55 by conventional processing, the same as FIGS. 10 and 11.
Figure 55:
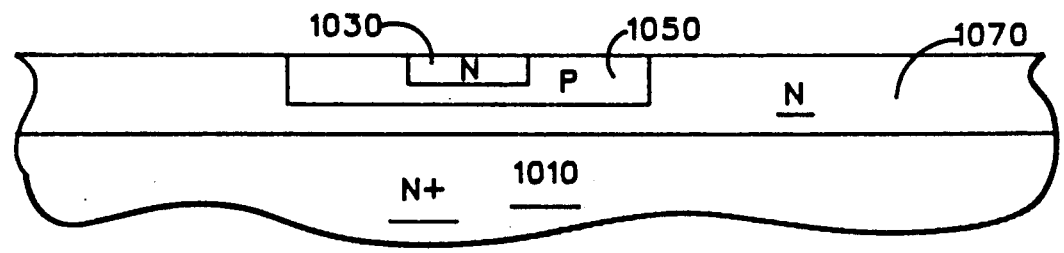
FIG. 55 is a view in cross-section of the bipolar device of FIG. 54 as in FIG. 11.

In FIGS. 54 and 55, wafer 1010 is doped N+, emitter 1030 is doped N, base 1050 is doped P and collector 1070 is N type.

Figure 56A:
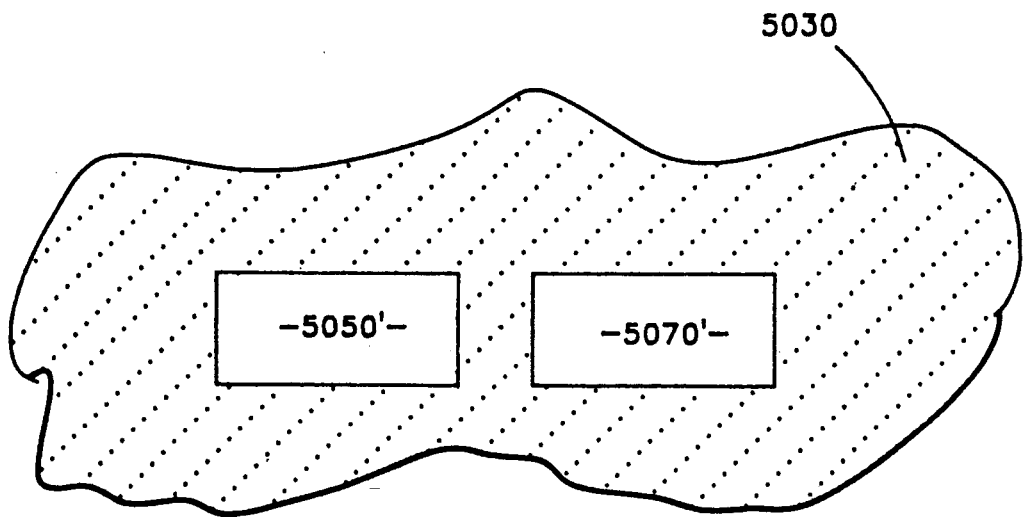
FIG. 56A is the mask of the silicide contact.
Figure 56:
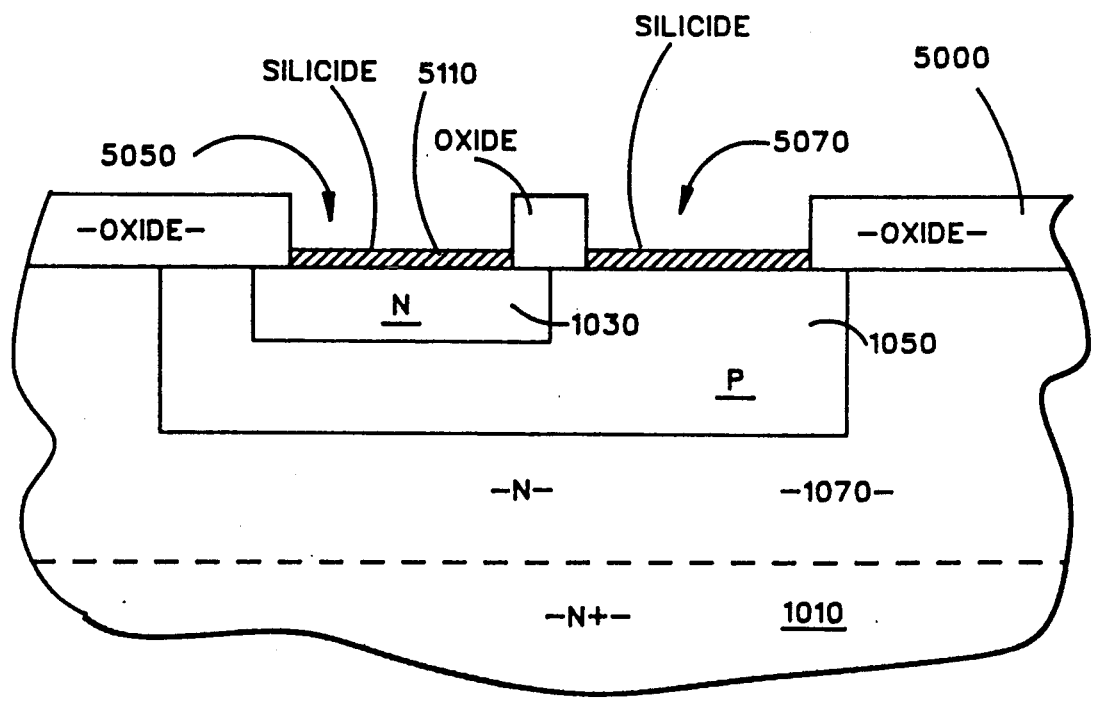
FIG. 56 is a new figure to show the application of a layer of silicide at least substantially covering the emitter and base electrodes for current enhancement.

New FIGS. 56, 56A show the optional silicide contact area enlarging step. Oxide layer 5000 is laid down on top of wafer 1010 and mask 5030 is used in conventional photoresist-lithography manner to open the large areas 5050 and 5070 over the emitter 1030 and the base 1050, respectively. These areas are much larger than the sub-micron contact areas in order that a much larger number of atoms will be available under these electrodes to supply electrons for current to each contact for increased current capacity. While the collector current may be twice as large as the emitter and base current, the entire back N+ wafer 1010 is available to deliver electrons to the collector contact, but it may be constructed in the same manner as the other contacts, if desired. N+ layer 1010 and N layer 1070 are the same for the collector contact (not shown).

To form the silicide 5110 in openings 5050 and 5070, a layer of titanium, platinum, tungsten, or the like is formed over the oxide 5000 and in the openings 5050 and 5070. Then, the wafer is exposed to high temperatures, such as 400° to 600° C. in a nitrogen atmosphere to form titanium, tungsten or platinum nitride over the oxide 5000, but silicide 5110 is formed over the exposed silicon.

Figure 57A:
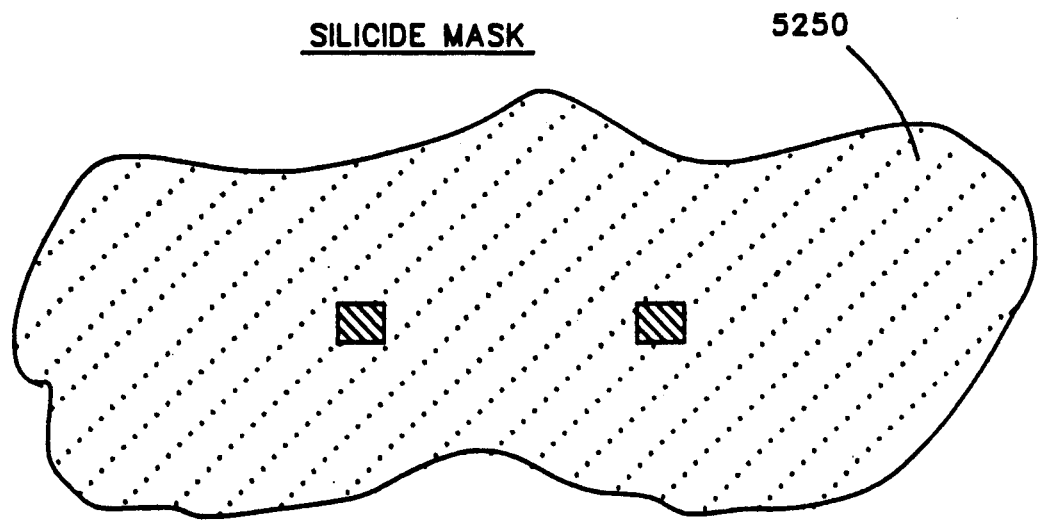
FIG. 57A is the mask of delineating the polysilicon electrode contact over regions 5110 of silicide.

Next, the oxide 5000 is removed and replaced by a layer of polysilicon 5200 (FIG. 57), over which a thin layer of nitride 5230 is deposited. Mask 5250 (FIG. 57A) delineates nitride buttons 5270 and 5290 over the regions 5110 of silicide for the respective contacts being formed.

In order to dope the polysilicon underneath nitride caps 5270, 5290, the original steps of FIGS. 15-20 may be used, followed by low temperature oxide and spin on glass with planarization and metallization to complete the device.

In the alternative, the steps of FIGS. 41-52 may be used to accomplish the same construction, as stated in the parent application.

In the following description, FIGS. 54 and 55 conform to original FIGS. 11, 12 while FIGS. 58-68 (for the conventional bipolar transistor) correspond to original FIGS. 41-52 (for the lateral bipolar transistor).

Figure 57:
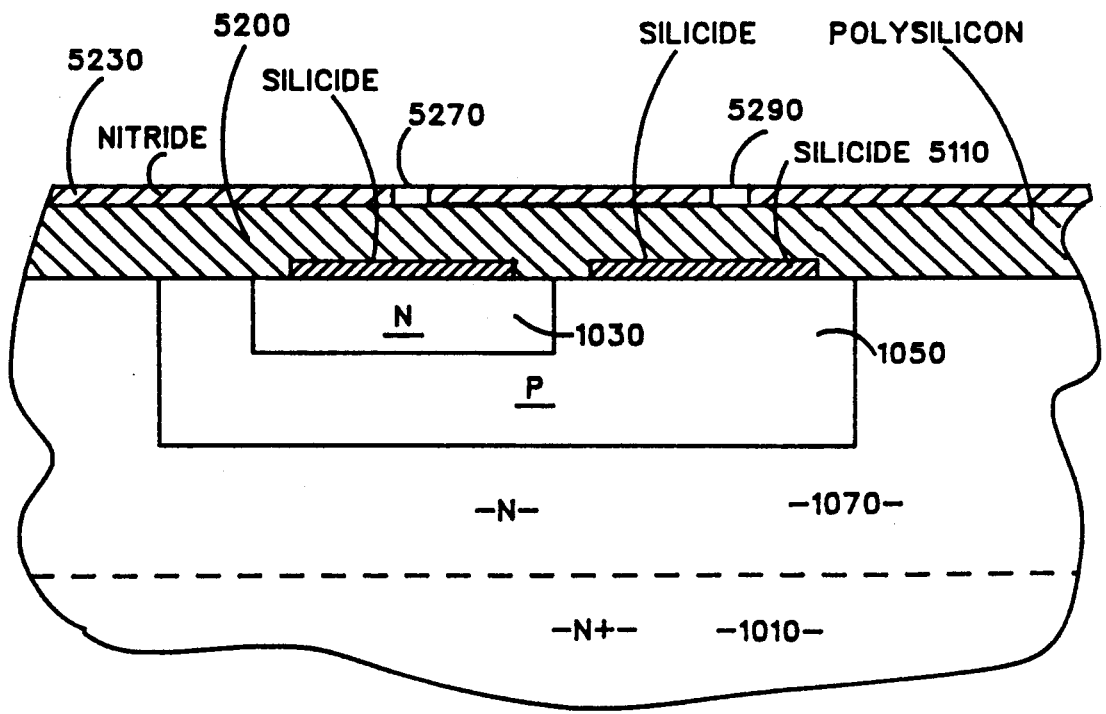
FIG. 57 shows the structure of FIG. 56 with the oxide layer removed and replaced by a layer of polysilicon, in turn covered by a layer of nitride which has been delineated by the mask of the FIG. 57A.
Figure 58:
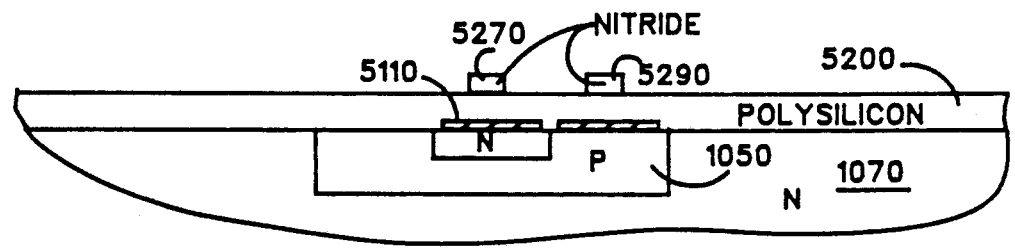
FIG. 58 shows the bipolar structure with the optional silicide extended contact areas beneath the nitride buttons defining the contact or electrode regions, similar to previously described FIG. 41.

To proceed from FIG. 57 to FIG. 58, the unhardened nitride 5230 is removed, leaving caps 5270 and 5290 isolated. These nitride buttons 5270, 5290 are preferably centered over the emitter 1030 and over the base 1050 or may just be a spot on base 1050, as seen in FIG. 58, although considerable leeway is available for any misalignment. If desired, the silicide 5110 on base 1050 may encircle emitter 1030.

Figure 59:
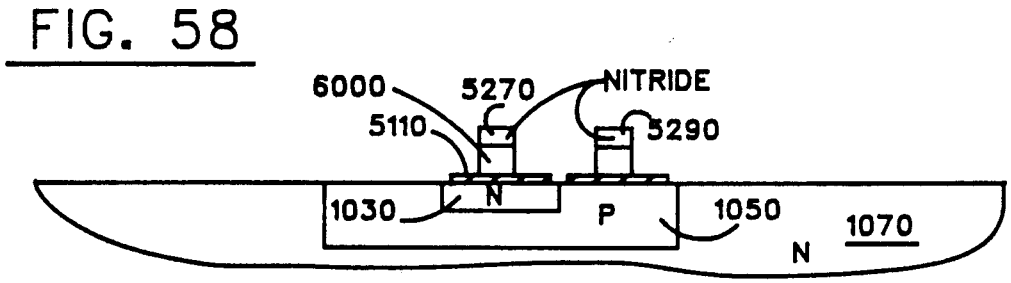
FIG. 59 depicts the isolated polysilicon contacts on top of the silicide contact area extenders, similar to previously described FIG. 42.

In FIG. 59, the unprotected polysilicon 5200 has been removed in conventional manner, such as by etching to leave undoped polysilicon contacts 6000, and 7000.

Figure 60:
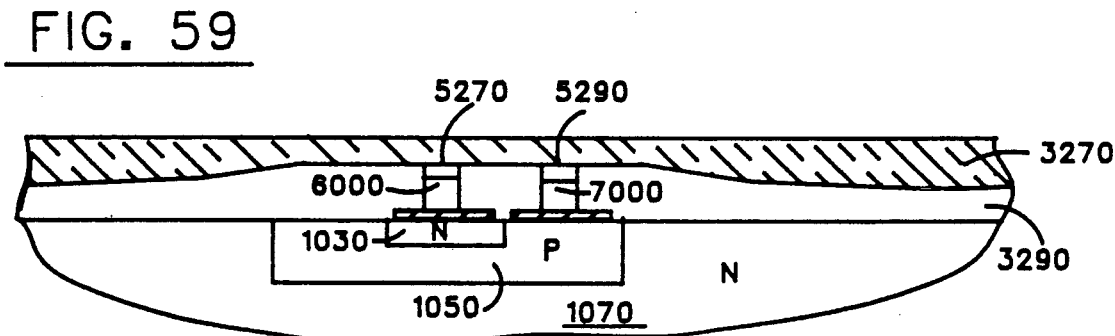
FIG. 60 reveals the plasma oxide covering the contacts, and in turn covered by glass (SOG), similar to FIG. 43.

In FIG. 60, plasma oxide 3290 is deposited using the conventional planarization process to a depth of approximately 3000 angstroms. This step is followed by spin on glass 3270 (SOG) so as to look substantially planar. Note here, layers 3290 and 3270 are both oxide compounds, but are never oxidized in this process.

Figure 61:
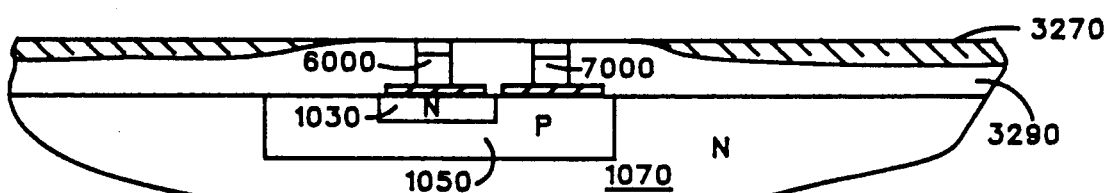
FIG. 61 planarizes the structure of FIG. 60 down to the tops of the nitride buttons, similar to FIG. 44.

In FIG. 61, a reactive ion etching (RIE) conventional step is carried out for effecting planarization which exposes the nitride buttons 5270 and 5290 and is terminated approximately at the level of the tops of these buttons.

Figure 62:
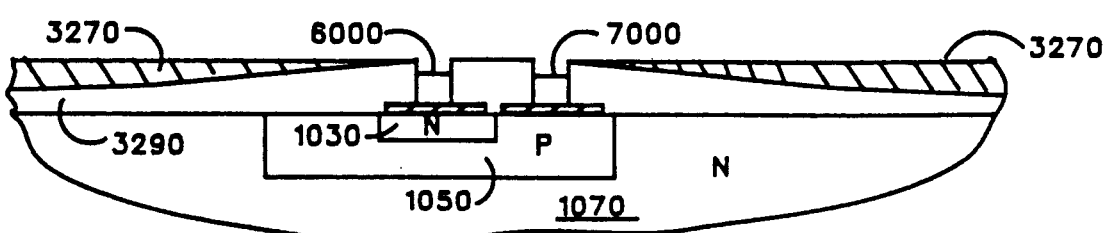
FIG. 62 shows the structure of FIG. 61 with the nitride buttons removed, similar to FIG. 45.

In FIG. 62, the nitride buttons 5270 and 5290 have been removed from the contacts 6000 and 7000 using a conventional step to prepare the contacts for doping to make them properly conductive.

Figure 63A:
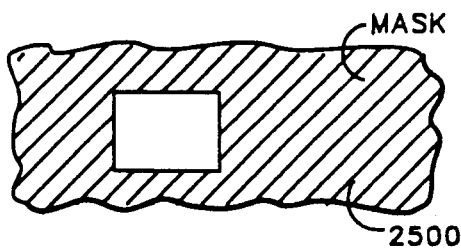
FIG. 63A shows the mask to be used in making a doping opening to the emitter contact.
Figure 63:
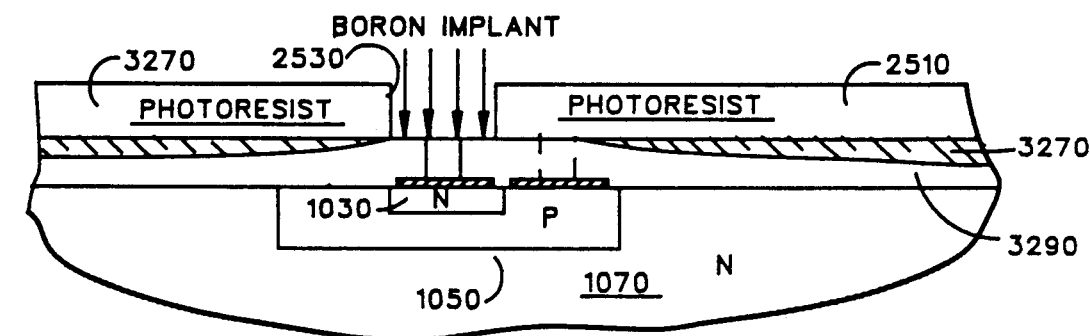
FIG. 63 shows the doping step for the emitter contact.

In FIG. 63A, mask 2500 is shown for delineating photoresist 2510, in the previous manner, to provide the opening 2530 for the boron implant, as shown by the arrows in FIG. 63.

Figure 64A:
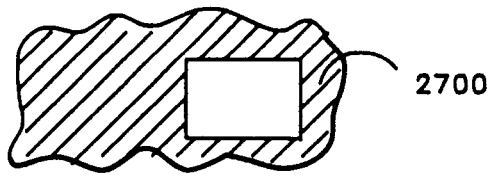
FIG. 64A shows the mask for doping the base contact.
Figure 64:
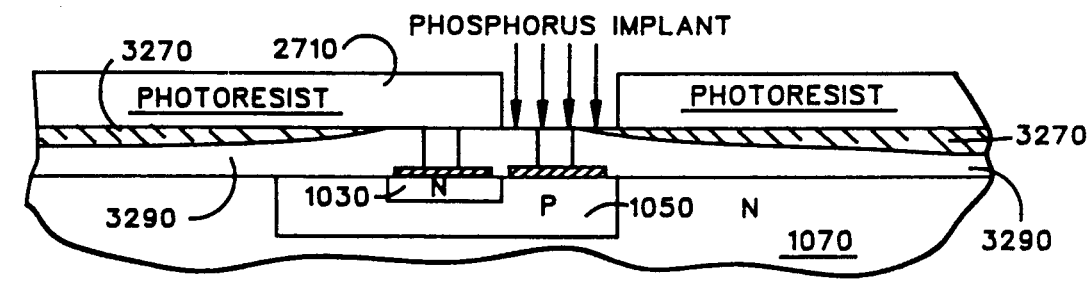
FIG. 64 shows the doping step for the base contact.

In similar fashion, mask 2700 of FIG. 64A is utilized to delineate the photoresist 2710 for the phosphorus implant, shown by the arrows (FIG. 64), thereby concluding the doping of the two polysilicon contacts 6000 and 7000 in the same N or P doping as their underlying base and emitter.

Figure 65:
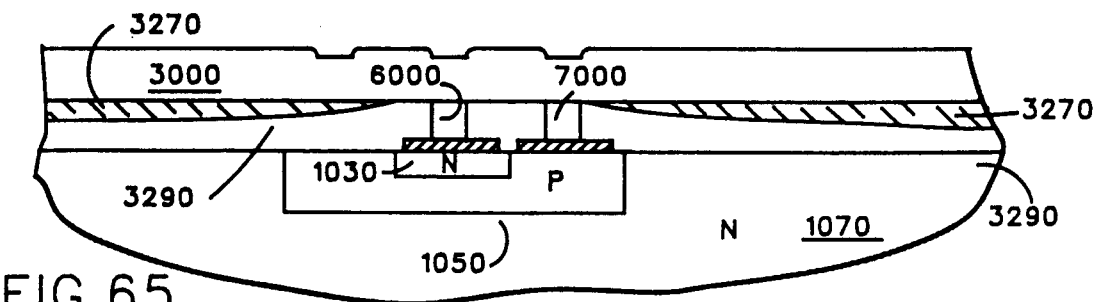
FIG. 65 shows the metal interconnect layer.
Figure 66:
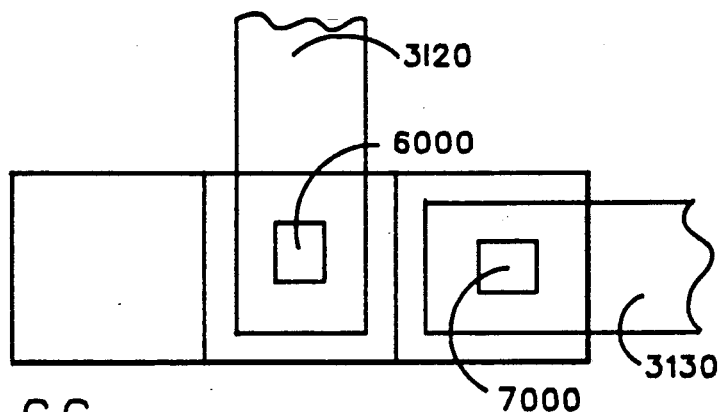
FIG. 66 shows the delineated metal interconnects for the emitter and base contacts.
Figure 67:
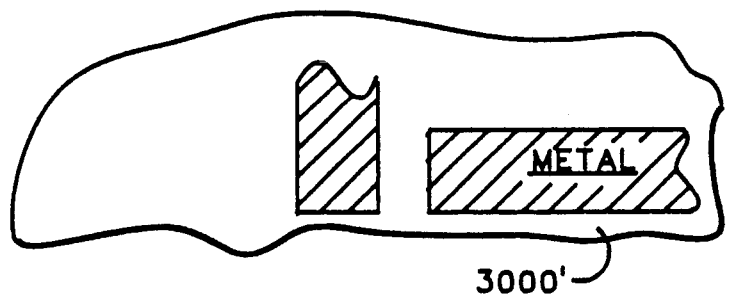
FIG. 67 shows the mask for effecting the delineation.

In FIG. 65, the metal layer 3000 has been applied over this structure, and the metal mask of FIG. 67, shown at 3000', is used, and the metal is etched to provide the metal interconnects 3120, to the doped poly electrode 6000 of the emitter 1030 and interconnect 3130 to the doped poly electrode 7000 of base 1050.

Figure 68:
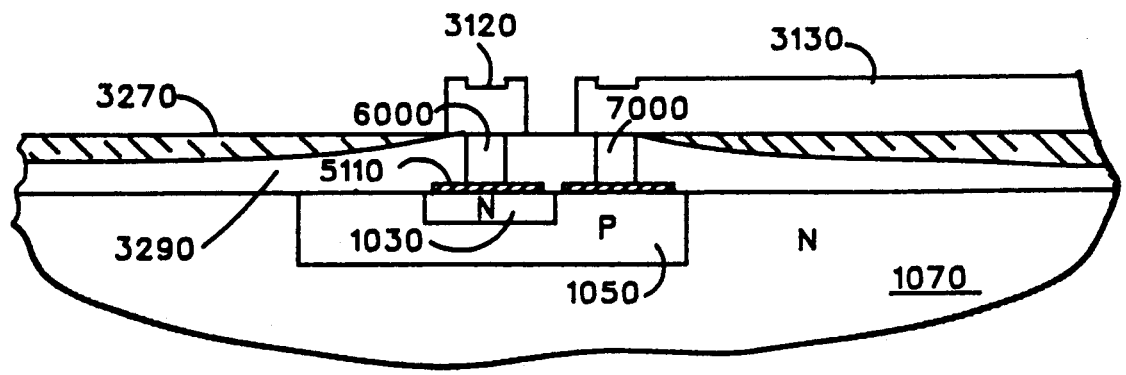
FIG. 68 shows the completed conventional bipolar device with optional silicide and with the plasma oxide and glass insulation.

FIG. 68 shows the completed device made in this fashion.

When using the silicide area contacts 5110, the maximum dimension of the tops of contacts 6000 and 7000 may be even less than 0.1 micron. The principles of these contacts thus present a range of at least 0.1 to 1 microns, the maximum dimension being a diameter or a side. The 1 micron contacts are useful on devices larger than sub-micron.

Figure 69:
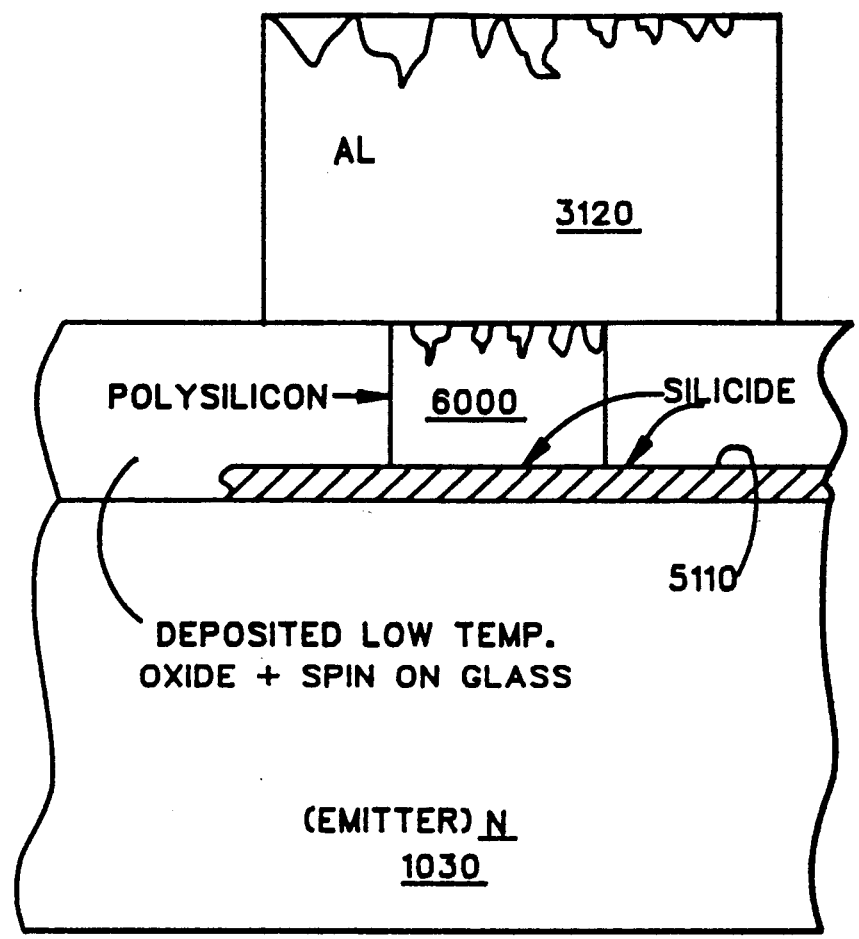
FIG. 69 is an enlarged views of a contact on a silicide region with an aluminum interconnect to the contact; and, FIG. 70 is a schematic drawing of an equivalent circuit for the structure of FIG. 69.
Figure 70:
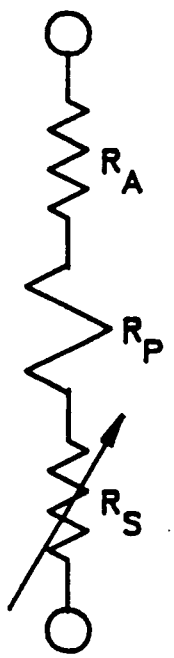

In FIGS. 69 and 70, contact 6000 is shown greatly enlarged and relatively located in its normal position. Emitter 1030 is an N diffusion on which silicide 5110 is formed. Contact 6000 is doped polysilicon formed on the silicide layer, and surrounded by deposited (snowed-on) low temperature oxide, in turn covered by spin on glass.

Aluminum interconnect 3120 is shown over top of the contact 6000, and slivers of aluminum penetrate the top portion of the contact. This function is represented by resistor $R_A$ in FIG. 70, with the resistance of the polysilicon shown as resistor $R_P$ and the resistance of the silicide as $R_S$.

It will be understood that in the absence of silicide 5110 (FIG. 69), the resistance $R_S$ (FIG. 70) would be much larger because it would have to represent the junction resistance between the silicon (emitter) 1030 and the polysilicon (contact) 6000. Since the area of the silicide is much greater than the contact junction in the absence of silicide, the resistance $R_S$ is much lower which also enhances the current flow through contact 6000. Resistors $R_A$ (aluminum 3120 to polysilicon 6000) and $R_P$ (polysilicon 6000) remain unchanged.

What is claimed is:

1. A sub-micron bipolar device comprising in combination:
   a substrate;
   an insulation layer comprising spin on glass over low temperature oxide on a surface of the substrate with openings therethrough to the substrate;
   an active region in the substrate below said openings;
   a base and an emitter in the active region with the base and emitter oppositely doped;
   said insulation embedding the tops of the base and emitter;
   doped polysilicon electrodes extending upwardly from the tops of the base and emitter, respectively via said openings in the insulation layer, and said electrodes each having a top;
   the tops of said electrodes comprising contacts, each with a cross section having maximum dimensions in the range approximately 0.1 to 1.0 microns,
   silicide electrode enlarging layers respectively disposed solely on the base between the base and its doped polysilicon electrode and solely on the emitter between the emitter and its doped polysilicon electrode, and each enlarging layer being much larger than the cross sectional areas for the respective electrodes in order that a much larger number of atoms will be available under said electrodes to supply electrons for current to each electrode for making the current available at its contact thereby establishing increased current capacity; and,
   metal interconnect conductors extending over the insulation to the tops of the electrodes respectively.

2. A sub-micron bipolar device, comprising in combination:
   a silicon substrate having a top surface;
   an active region in the substrate;
   at least two diffusion regions in said active region adjacent to the top surface of said substrate;
   doped polysilicon electrodes extending upwardly from the tops of the diffusion regions, respectively, without overlapping any of the active region boundaries, and said electrodes each having a top;
   insulation comprising spin on glass over low temperature oxide substantially embedding the electrodes except for the tops thereof and covering at least the remaining portions of the active region;
   a contact respectively comprising the top of each said electrode, each said contact having a cross section having dimensions in the range 0.1 micron to 1.0 micron;
   silicide (contact area extender regions) electrode enlarging layers respectively disposed solely on the silicon surface of each diffusion region between each of the diffusion regions and its doped polysilicon electrode, and each enlarging layer being much larger than the cross sectional areas for the respective electrodes in order that a much larger number of atoms will be available under said electrodes to supply electrons for current to each electrode contact thereby establishing increased current capacity; and,
   metal interconnect conductors respectively extending over said insulation to each of said contacts.

3. The device of claim 2, wherein:
   said at least two diffusions comprise an emitter doped one type and a base doped a different type.

* * * * *